US011686787B2

(12) United States Patent
Makino

(10) Patent No.: US 11,686,787 B2
(45) Date of Patent: Jun. 27, 2023

(54) MAGNETIC SENSOR

(71) Applicant: TDK CORPORATION, Tokyo (JP)

(72) Inventor: Kenzo Makino, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 18/074,044

(22) Filed: Dec. 2, 2022

(65) Prior Publication Data

US 2023/0102107 A1 Mar. 30, 2023

Related U.S. Application Data

(63) Continuation of application No. 17/360,804, filed on Jun. 28, 2021, now Pat. No. 11,543,470.

(30) Foreign Application Priority Data

Jul. 21, 2020 (JP) ................. 2020-124514

(51) Int. Cl.
*G01R 33/09* (2006.01)
*G01R 33/00* (2006.01)
*G01B 7/30* (2006.01)
*H10N 50/10* (2023.01)

(52) U.S. Cl.
CPC ............ *G01R 33/091* (2013.01); *G01B 7/30* (2013.01); *G01R 33/0005* (2013.01); *G01R 33/093* (2013.01); *H10N 50/10* (2023.02)

(58) Field of Classification Search
CPC ....... G01R 33/091; G01R 33/093; G01B 7/30
See application file for complete search history.

(56) References Cited

U.S. PATENT DOCUMENTS

| 4,835,510 A | 5/1989 | Shibasaki et al. |
| 5,521,501 A | 5/1996 | Dettmann et al. |
| 2008/0211490 A1* | 9/2008 | Kurata ................ B82Y 25/00 |
| | | 324/207.21 |
| 2015/0285873 A1 | 10/2015 | Cai et al. |

FOREIGN PATENT DOCUMENTS

| JP | S61-120915 A | 6/1986 |
| JP | H07-226546 A | 8/1995 |
| JP | H09-219547 A | 8/1997 |

* cited by examiner

*Primary Examiner* — Alesa Allgood
(74) *Attorney, Agent, or Firm* — Oliff PLC

(57) ABSTRACT

A magnetic sensor includes first to fourth resistor sections and a plurality of MR elements. Each of the plurality of MR elements belongs to any of first to fourth groups. The first to fourth groups are defined based on the areas of top surfaces of the MR elements. The first resistor section, the second resistor section, the third resistor section, and the fourth resistor section are constituted of the first group, the second group, the third group, and the fourth group, respectively; the second group, the first group, the fourth group, and the third group, respectively; the first group, the fourth group, the third group, and the second group, respectively; or the third group, the second group, the first group, and the fourth group, respectively.

11 Claims, 24 Drawing Sheets

MAGNETIC SENSOR

CROSS-REFERENCE TO RELATED APPLICATION

This is a Continuation of application Ser. No. 17/360,804 filed Jun. 28, 2021, which claims the benefit of Japanese Patent Application No. 2020-124514 filed Jul. 21, 2020. The disclosure of the prior applications is hereby incorporated by reference herein in its entirety.

BACKGROUND OF THE INVENTION

1. Field of the Invention

The present invention relates to a magnetic sensor including a plurality of magnetoresistive elements.

2. Description of the Related Art

Magnetic sensors have been used for a variety of applications. A type of the magnetic sensor in which a detection signal depending on an external magnetic field is generated using a magnetoresistive element (hereinafter also referred to as an MR element) whose resistance is variable depending on the external magnetic field is known. A type of the magnetic sensor that has a bridge circuit constituted of a plurality of MR elements is also known.

A magnetic sensor having a half-bridge circuit, as the bridge circuit, includes a power port to which a predetermined voltage is applied, a ground port connected to a ground, and an output port, in addition to the half-bridge circuit. One or more MR elements, as a first resistor section, are provided between the power port and the output port. One or more MR elements, as a second resistor section, are provided between the ground port and the output port. A detection signal corresponds to the electric potential of the output port.

A magnetic sensor having a Wheatstone bridge circuit, as the bridge circuit, includes a power port to which a predetermined voltage is applied, a ground port connected to a ground, and first and second output ports, in addition to the Wheatstone bridge circuit. One or more MR elements, as a first resistor section, are provided between the power port and the first output port. One or more MR elements, as a second resistor section, are provided between the ground port and the first output port. One or more MR elements, as a third resistor section, are provided between the ground port and the second output port. One or more MR elements, as a fourth resistor section, are provided between the power port and the second output port. A detection signal corresponds to the potential difference between the first and second output ports.

JP 61-120915 A, JP 07-226546 A, U.S. Pat. No. 5,521,501 A, and JP 09-219547 A describe magnetic sensors having Wheatstone bridge circuits. U.S. Pat. No. 4,835,510 A describes a magnetic sensor having a Wheatstone bridge circuit, and a magnetic sensor having a half-bridge circuit. US 2015/0285873 A1 describes a magnetic sensor having a Wheatstone bridge circuit. US 2015/0285873 A1 describes formation of the Wheatstone bridge circuit on a substrate in which a bump, being a stepped section, is formed.

The MR element is formed by, for example, photolithography. To be more specific, a plurality of the MR elements are formed by etching a MR film formed on a substrate by, for example, ion milling using a photoresist mask formed using photolithography. In general, the plurality of MR elements are designed so as to have the same dimensions in a horizontal direction (hereinafter simply referred to as dimensions). However, in actual fact, the dimensions of the MR elements sometimes have variations. The dimensions of the MR elements depend on the dimensions of the photoresist mask.

The dimensions of the MR elements also depend on the thickness of the photoresist mask. The reason thereof is as follows. When the thickness of the photoresist mask varies, for example, an area shaded by the photoresist mask during ion milling varies. Accordingly, an etched area varies, and thereby the dimensions of the MR elements vary. Note that the dimensions of the MR elements decrease with reduction in the thickness of the photoresist mask.

The thickness of the photoresist mask depends on the thickness of a photoresist layer formed on the substrate.

The thickness of the photoresist layer also affects the dimensions of the photoresist mask. At the time of exposure, an incident light on the photoresist layer, a reflected light from a surface of the photoresist layer, and a reflected light from an interface between the photoresist layer and the substrate are present. These lights interfere with one another. When the thickness of the photoresist layer varies, a state of interference between the incident light and the reflected lights and the amount of light absorbed by the photoresist layer vary. As a result, a photosensitive region of the photoresist layer varies, and hence the dimensions of a portion that remains as the photoresist mask after development varies. Note that the dimensions of the photoresist mask (the dimensions of the MR elements) sometimes increase and sometimes decrease as the thickness of the photoresist layer is reduced. Whether the dimensions increase or decrease depends on the state of the interference.

In general, the magnetic sensor having the bridge circuit is designed such that each resistor section has a same number of MR elements of the same dimensions. However, if the dimensions of the MR elements vary, as described above, the resistance of each resistor section deviates from a desired value, and as a result, an offset may occur in a detection signal. There is also a case in which a plurality of magnetic sensors manufactured from the same wafer exhibit variations in the offset of the detection signal. More specifically, when a substrate has a stepped section, as described in US 2015/0285873 A1, the dimensions of the MR elements widely vary, and as a result, the offset of the detection signal becomes large.

SUMMARY OF THE INVENTION

An object of the present invention is to provide a magnetic sensor that can reduce an offset of a detection signal of the magnetic sensor.

A magnetic sensor according to each of first to fourth aspects of the present invention includes a power port, a ground port, a first output port, a second output port, a first resistor section provided between the power port and the first output port, a second resistor section provided between the ground port and the first output port, a third resistor section provided between the ground port and the second output port, a fourth resistor section provided between the power port and the second output port, and a plurality of magnetoresistive elements constituting the first to fourth resistor sections. A detection signal is a signal corresponding to a potential difference between the first output port and the second output port.

In the magnetic sensors according to the first and second aspects of the present invention, each of the plurality of magnetoresistive elements belongs to any of a first group, a second group, a third group, and a fourth group, and one or more magnetoresistive elements of the plurality of magnetoresistive elements belong to each of the first to fourth groups. Each of the plurality of magnetoresistive elements is constituted of a plurality of laminated layers, and has a top surface located at an end of the plurality of layers in a direction of lamination.

In the magnetic sensor according to the first aspect of the present invention, a maximum area of the top surfaces of the one or more magnetoresistive elements belonging to the first group is larger than areas of the top surfaces of all of the magnetoresistive elements belonging to the second to fourth groups. A minimum area of the top surfaces of the one or more magnetoresistive elements belonging to the second group is smaller than areas of the top surfaces of all of the magnetoresistive elements belonging to the first, third, and fourth groups. An average area of the top surfaces of the one or more magnetoresistive elements belonging to the third group is smaller than an average area of the top surfaces of the one or more magnetoresistive elements belonging to the fourth group.

In the magnetic sensor according to the first aspect of the present invention, the first resistor section, the second resistor section, the third resistor section, and the fourth resistor section are constituted of the first group, the second group, the third group, and the fourth group, respectively; the second group, the first group, the fourth group, and the third group, respectively; the first group, the fourth group, the third group, and the second group, respectively; or the third group, the second group, the first group, and the fourth group, respectively.

In the magnetic sensor according to the second aspect of the present invention, an average area of the top surfaces of the one or more magnetoresistive elements belonging to the third group is larger than an average area of the top surfaces of the one or more magnetoresistive elements belonging to the second group. An average area of the top surfaces of the one or more magnetoresistive elements belonging to the first group is larger than an average area of the top surfaces of the one or more magnetoresistive elements belonging to the third group. An average area of the top surfaces of the one or more magnetoresistive elements belonging to the fourth group is larger than an average area of the top surfaces of the one or more magnetoresistive elements belonging to the first group.

In the magnetic sensor according to the second aspect of the present invention, the first resistor section, the second resistor section, the third resistor section, and the fourth resistor section are constituted of the first group, the second group, the third group, and the fourth group, respectively; or the second group, the first group, the fourth group, and the third group, respectively.

The magnetic sensors according to the first and second aspects of the present invention each may further include a support member that supports the plurality of magnetoresistive elements. The support member may have a flat first surface, and a second surface located at a different position from the first surface in a direction perpendicular to the first surface. The plurality of magnetoresistive elements may be located on any of the first surface and the second surface of the support member.

The magnetic sensors according to the third and fourth aspects of the present invention each further include a support member that supports the plurality of magnetoresistive elements. The support member has a first section having a flat first surface, and a second section having a second surface located at a different position from the first surface in a first direction perpendicular to the first surface. The plurality of magnetoresistive elements are located on any of the first surface and the second surface of the support member.

In the magnetic sensor according to the third aspect of the present invention, each of the plurality of magnetoresistive elements is located in any of a first region, a second region, a third region, and another region that is other than the first to third regions. In each of the first to third regions, an element group, which is a set of one or more magnetoresistive elements of the plurality of magnetoresistive elements, is located. In the other region, two or more magnetoresistive elements of the plurality of magnetoresistive elements are located. The first to third regions are aligned along a second direction that is parallel to a virtual straight line orthogonal to the first direction. The virtual straight line is along a reference portion which is a part of an outer edge of the second section, while intersecting at least a part of the reference portion. The other region is at a different position from the first to third regions in a third direction that is orthogonal to the first direction and intersects the virtual straight line.

In the magnetic sensor according to the third aspect of the present invention, the element group in the first region and the element group in the third region constitute a divided resistor section. The element group in the second region constitutes an undivided resistor section. Any of sets of ordered two resistor sections, including: a set of the first resistor section and the fourth resistor section; a set of the second resistor section and the third resistor section; a set of the first resistor section and the second resistor section; and a set of the second resistor section and the first resistor section, corresponds to a set of the divided resistor section and the undivided resistor section. The two or more magnetoresistive elements in the other region constitute two resistor sections other than two resistor sections corresponding to the divided resistor section and the undivided resistor section.

Note that "ordered two resistor sections" means that two resistor sections individually correspond to a first element and a second element of a set of two resistor sections. "A set of two resistor sections corresponds to a set of a divided resistor section and an undivided resistor section" means that a first element of the set of two resistor sections corresponds to the divided resistor section, and a second element of the set of two resistor sections corresponds to the undivided resistor section.

In the magnetic sensor according to the third aspect of the present invention, the other region may include a fourth region, a fifth region, and a sixth region. In each of the fourth to sixth regions, an element group may be located. The fourth to sixth regions may be aligned along the second direction. The element group in the first region and the element group in the third region may constitute a first divided resistor section as the divided resistor section. The element group in the fourth region and the element group in the sixth region may constitute a second divided resistor section. The element group in the fifth region may constitute a first undivided resistor section. The element group in the second region may constitute a second undivided resistor section as the undivided resistor section.

In the magnetic sensor according to the third aspect of the present invention, in the case of constituting the first and second divided resistor sections and the first and second undivided resistor sections, any of sets of ordered four resistor sections, including: a set of the first resistor section, the second resistor section, the third resistor section, and the fourth resistor section; a set of the first resistor section, the third resistor section, the second resistor section, and the fourth resistor section; a set of the first resistor section, the third resistor section, the fourth resistor section, and the second resistor section; a set of the first resistor section, the fourth resistor section, the third resistor section, and the second resistor section; and a set of the second resistor section, the third resistor section, the fourth resistor section, and the first resistor section may correspond to a set of the first divided resistor section, the second divided resistor section, the first undivided resistor section, and the second undivided resistor section.

Note that "ordered four resistor sections" means that four resistor sections individually correspond to a first element, a second element, a third element, and a fourth element of a set of four resistor sections. "A set of four resistor sections corresponds to a set of a first divided resistor section, a second divided resistor section, a first undivided resistor section, and a second undivided resistor section" means that a first element of the set of four resistor sections corresponds to the first divided resistor section, a second element of the set of four resistor sections corresponds to the second divided resistor section, a third element of the set of four resistor sections corresponds to the first undivided resistor section, and a fourth element of the set of four resistor sections corresponds to the second undivided resistor section.

In the magnetic sensor according to the fourth aspect of the present invention, each of the plurality of magnetoresistive elements is located in any of a first region, a second region, a third region, and a fourth region, and an element group being a set of one or more magnetoresistive elements of the plurality of magnetoresistive elements is located in each of the first to fourth regions. The first to fourth regions are aligned along a second direction that is parallel to a virtual straight line orthogonal to the first direction. The virtual straight line is along a reference portion which is a part of an outer edge of the second section, while intersecting at least a part of the reference portion.

In the magnetic sensor according to the fourth aspect of the present invention, the first resistor section, the second resistor section, the third resistor section, and the fourth resistor section are constituted of: the element group in the third region, the element group in the first region, the element group in the second region, and the element group in the fourth region, respectively; or the element group in the first region, the element group in the third region, the element group in the fourth region, and the element group in the second region, respectively.

In the magnetic sensors according to the first and second aspects of the present invention, each of the plurality of magnetoresistive elements belongs to any of first to fourth groups. The first to fourth groups are defined based on the areas of top surfaces of the magnetoresistive elements. Therefore, according to the present invention, it is possible to reduce an offset of the detection signal of the magnetic sensor.

In the magnetic sensor according to the third aspect of the present invention, each of the plurality of magnetoresistive elements is located in any of the first to third regions and the other region that is other than the first to third regions. The positions of the first to third regions are defined based on the reference portion which is a part of the outer edge of the second section of the support member. Therefore, according to the present invention, it is possible to reduce an offset of the detection signal of the magnetic sensor.

In the magnetic sensor according to the fourth aspect of the present invention, each of the plurality of magnetoresistive elements is located in any of the first to fourth regions. The positions of the first to fourth regions are defined based on the reference portion which is a part of the outer edge of the second section of the support member. Therefore, according to the present invention, it is possible to reduce an offset of the detection signal of the magnetic sensor.

Other and further objects, features and advantages of the present invention will appear more fully from the following description.

DETAILED DESCRIPTION OF THE PREFERRED EMBODIMENTS

First Embodiment

Preferred embodiments of the present invention will now be described in detail with reference to the drawings. An outline of a magnetic sensor system including a magnetic sensor according to a first embodiment of the present invention will initially be described with reference to FIG. 1. A magnetic sensor system 100 according to the present embodiment includes a magnetic sensor device 1 and a magnetic field generator 5. The magnetic sensor device 1 includes the magnetic sensor according to the present embodiment. The magnetic field generator 5 generates a target magnetic field MF, which is a magnetic field (detection target magnetic field) to be detected by the magnetic sensor device 1.

The magnetic field generator 5 is rotatable about a rotation axis C. The magnetic field generator 5 includes a pair of magnets 6A and 6B. The magnets 6A and 6B are arranged at symmetrical positions with a virtual plane including the rotation axis C at the center. The magnets 6A and 6B each have an N pole and an S pole. The magnets 6A and 6B are located in an orientation such that the N pole of the magnet 6A is opposed to the S pole of the magnet 6B. The magnetic field generator 5 generates the target magnetic field MF in the direction from the N pole of the magnet 6A to the S pole of the magnet 6B.

The magnetic sensor device 1 is located at a position where the target magnetic field MF at a predetermined reference position can be detected. The reference position may be located on the rotation axis C. In the following description, the reference position is located on the rotation axis C. The magnetic sensor device 1 detects the target magnetic field MF generated by the magnetic field generator 5, and generates at least one or more detection signals. Each of the at least one or more detection signals has a correspondence with a relative position, and more specifically, a rotational position of the magnetic field generator 5 with respect to the magnetic sensor device 1.

Figure 1:
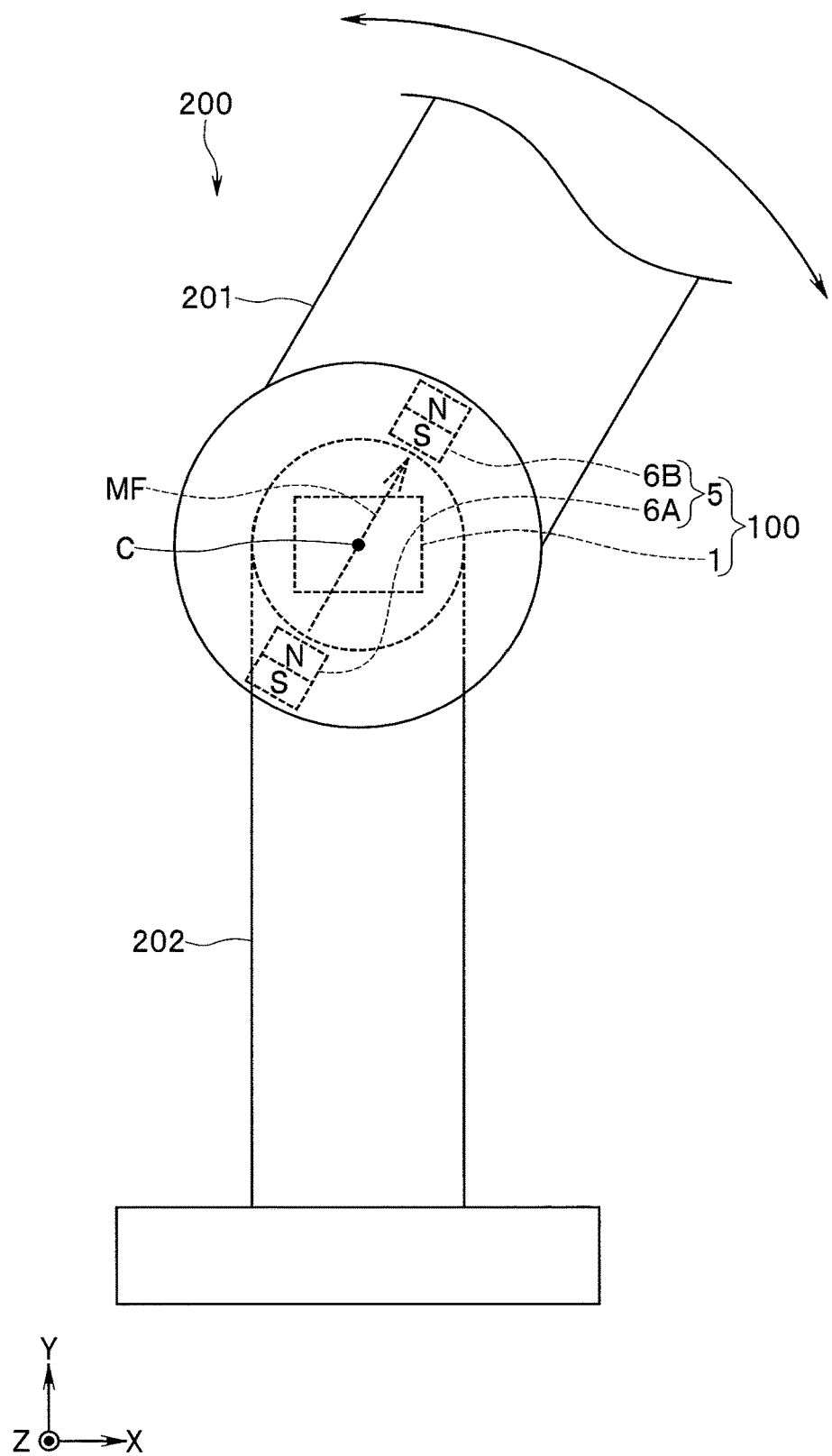
FIG. 1 is an explanatory diagram showing a schematic configuration of a magnetic sensor system of a first embodiment of the invention.

The magnetic sensor system 100 can be used as a device for detecting the rotational position of a rotatable moving part in an apparatus that includes the moving part. Examples of such an apparatus include a joint of an industrial robot. FIG. 1 shows an example where the magnetic sensor system 100 is applied to an industrial robot 200.

The industrial robot 200 shown in FIG. 1 includes a moving part 201 and a support unit 202 that rotatably supports the moving part 201. The moving part 201 and the support unit 202 are connected at a joint. The moving part 201 rotates about the rotation axis C. For example, if the magnetic sensor system 100 is applied to the joint of the industrial robot 200, the magnetic sensor device 1 may be fixed to the support unit 202, and the magnets 6A and 6B may be fixed to the moving part 201.

Now, we define X, Y, and Z directions as shown in FIG. 1. The X, Y, and Z directions are orthogonal to one another. In the present embodiment, a direction parallel to the rotation axis C (in FIG. 1, a direction out of the plane of the drawing) will be referred to as the Z direction. In FIG. 1, the X direction is shown as a rightward direction, and the Y direction is shown as an upward direction. The opposite directions to the X, Y, and Z directions will be referred to as −X, −Y, and −Z directions, respectively. The direction of the target magnetic field MF at the reference position is represented as a direction in an XY plane including the reference position. The direction of the target magnetic field MF at the reference position rotates about the reference position in the XY plane.

Figure 2:
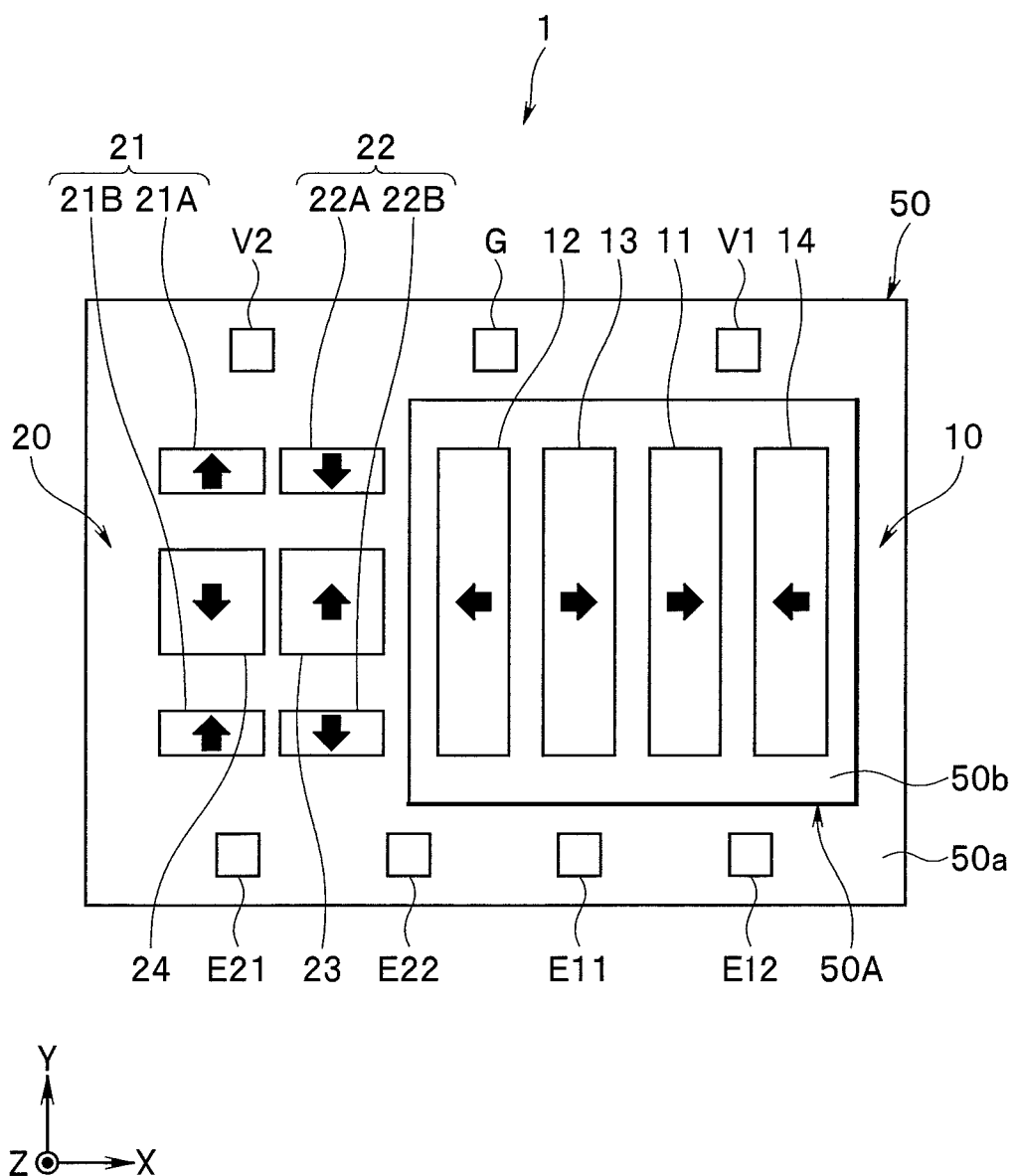
FIG. 2 is a plan view showing a magnetic sensor device of the first embodiment of the invention.
Figure 3:
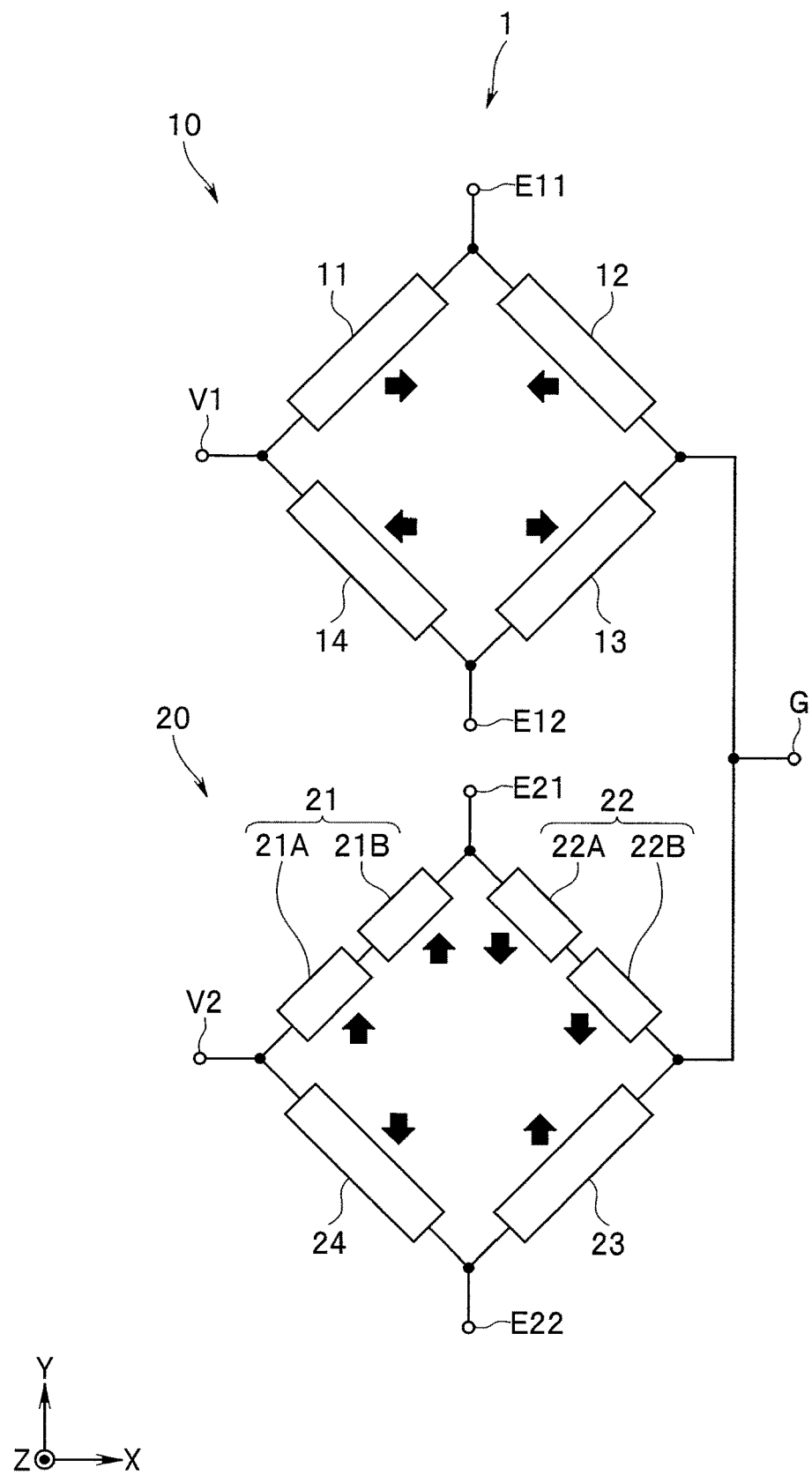
FIG. 3 is a circuit diagram showing the circuit configuration of the magnetic sensor device of the first embodiment of the invention.
Figure 4:
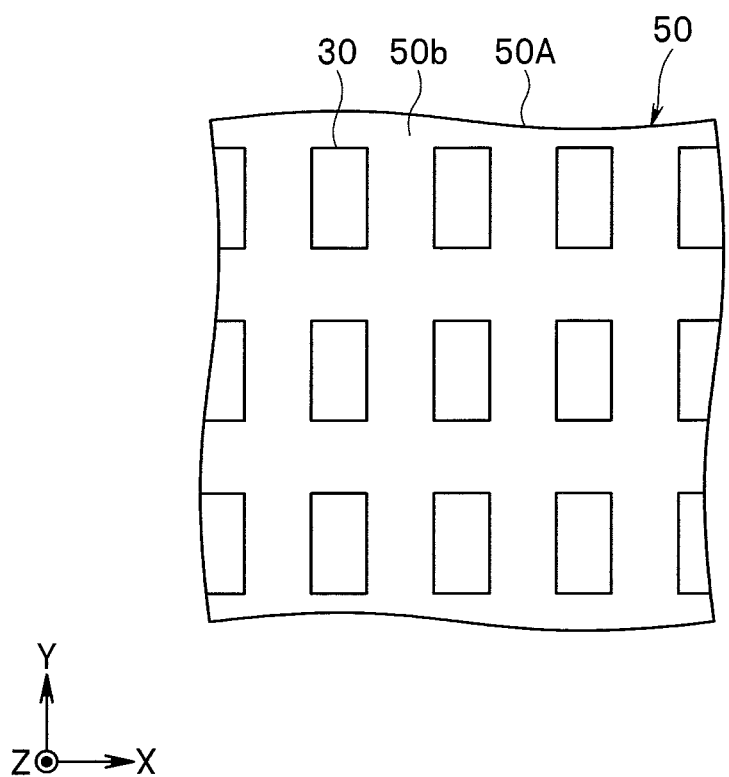
FIG. 4 is a plan view showing a part of a magnetic sensor according to the first embodiment of the invention.
Figure 5:
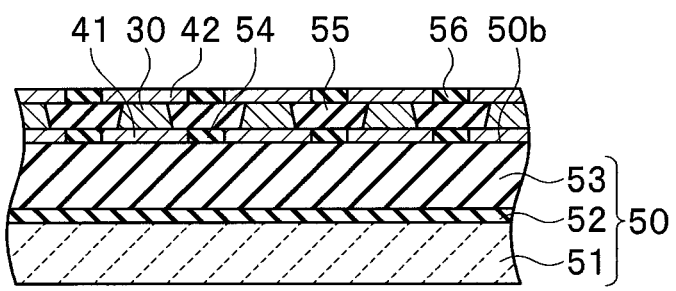
FIG. 5 is a sectional view showing a part of the magnetic sensor according to the first embodiment of the invention.
Figure 6:
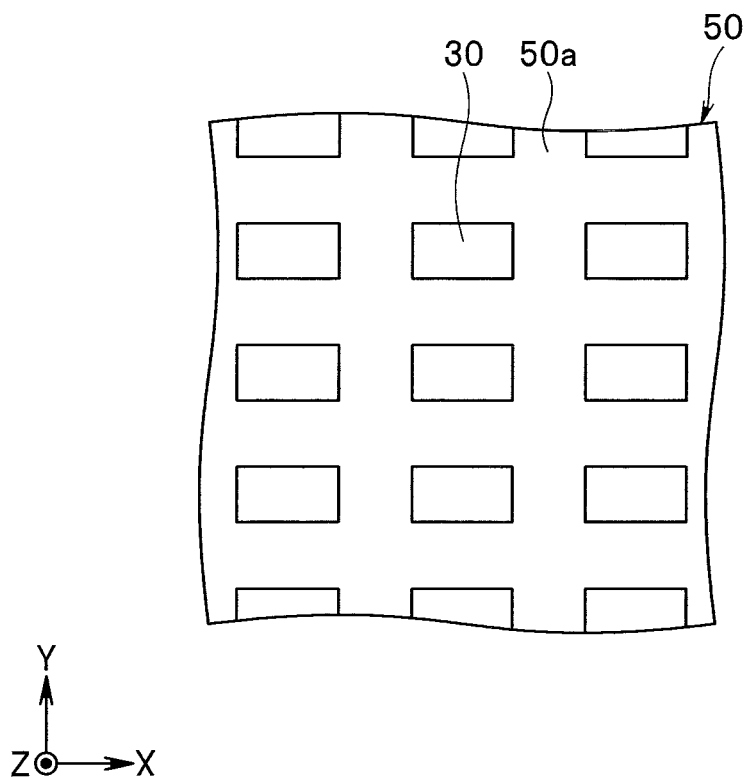
FIG. 6 is a plan view showing another part of the magnetic sensor according to the first embodiment of the invention.
Figure 7:
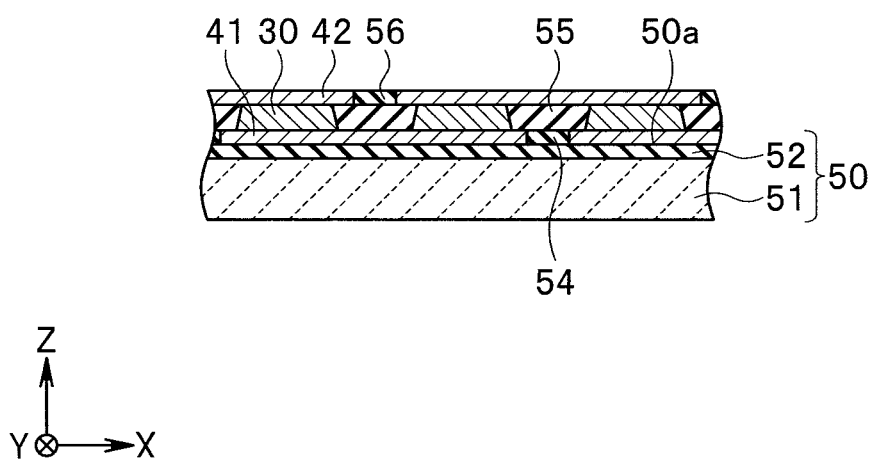
FIG. 7 is a sectional view showing another part of the magnetic sensor according to the first embodiment of the invention.

Next, a configuration of the magnetic sensor device 1 will be described with reference to FIGS. 2 to 7. FIG. 2 is a plan view showing the magnetic sensor device 1. FIG. 3 is a circuit diagram showing the circuit configuration of the magnetic sensor device 1. FIG. 4 is a plan view showing a part of a magnetic sensor. FIG. 5 is a sectional view showing a part of the magnetic sensor. FIG. 6 is a plan view showing another part of the magnetic sensor. FIG. 7 is a sectional view showing another part of the magnetic sensor.

The magnetic sensor device 1, as a magnetic sensor according to the present embodiment, includes two magnetic sensors 10 and 20. The magnetic sensor 10 is hereinafter also referred to as a first magnetic sensor 10, and the magnetic sensor 20 is hereinafter also referred to as a second magnetic sensor 20. The first magnetic sensor 10 detects the target magnetic field MF, and generates a first detection signal S1 having a correspondence with the strength of a component of the target magnetic field MF in the X direction. The second magnetic sensor 20 detects the target magnetic field MF, and generates a second detection signal S2 having a correspondence with the strength of a component of the target magnetic field MF in the Y direction.

Each of the first and second magnetic sensors 10 and 20 includes a plurality of magnetoresistive elements 30 whose resistances vary in accordance with an external magnetic field, and a support member that supports the plurality of magnetoresistive elements 30. In the present embodiment, in particular, a common support member 50 is used as a support member for the first magnetic sensor 10 and a support member for the second magnetic sensor 20.

The magnetoresistive element 30 is hereinafter referred to as MR element 30. Each of the plurality of MR elements 30 is configured so as to detect the target magnetic field MF. Each of the plurality of MR elements 30 is constituted of a plurality of laminated layers, and has a top surface 30a located at an end of the plurality of layers in a direction of lamination. The direction of lamination of the plurality of layers is a direction parallel to the Z direction.

The support member 50 includes a flat first surface 50a, and a second surface 50b located at a different position from the first surface 50a in a direction perpendicular to the first surface 50a. In the present embodiment, in particular, the first surface 50a is a surface parallel to the XY plane. The support member 50 has a stepped section 50A, which protrudes from the first surface 50a in the Z direction. The second surface 50b is a surface that is located at an end of the stepped section 50A in the Z direction and is parallel to the XY plane. The stepped section 50A is, for example, rectangular in planar shape. Note that the planar shape is a shape viewed from above, i.e., from a position located ahead in the Z direction.

The plurality of MR elements 30 are located on any of the first surface 50a and the second surface 50b of the support member 50. In the present embodiment, in particular, the plurality of MR elements 30 of the first magnetic sensor 10 are located on the second surface 50b, and the plurality of MR elements 30 of the second magnetic sensor 20 are located on the first surface 50a.

As shown in FIGS. 5 and 7, the magnetic sensor device 1 includes a substrate 51, an insulating layer 52 located on the substrate 51, and an insulating layer 53 located on the insulating layer 52. The substrate 51 and the insulating layers 52 and 53 constitute the support member 50. The insulating layers 52 and 53 have top surfaces located at ends of the insulating layers 52 and 53 in the Z direction, respectively. The insulating layer 53, which is located on a part of the top surface of the insulating layer 52, constitutes the stepped section 50A of the support member 50. A part of the top surface of the insulating layer 52, which is uncovered with the insulating layer 53, constitutes the first surface 50a of the support member 50. The top surface of the insulating layer 53 constitutes the second surface 50b of the support member 50.

The substrate 51 is a semiconductor substrate made of a semiconductor such as Si, for example. The insulating layers 52 and 53 are made of an insulating material such as $SiO_2$, for example. The insulating layer 52 corresponds to a first section of the support member according to the present invention. The insulating layer 53, i.e., the stepped section 50A corresponds to a second section of the support member according to the present invention.

As shown in FIG. 3, the first magnetic sensor 10 and the second magnetic sensor 20 have basically the same circuit configuration. The following description doubles as a description about the configuration of the first magnetic sensor 10 (reference numerals at the front of parentheses) and a description about the configuration of the second magnetic sensor 20 (reference numerals in the parentheses). As shown in FIGS. 2 and 3, the first magnetic sensor 10 (20) includes a power port V1 (V2), a ground port G, a first output port E11 (E21), a second output port E12 (E22), a first resistor section 11 (21), a second resistor section 12 (22), a third resistor section 13 (23), and a fourth resistor section 14 (24). The plurality of MR elements 30 of the first magnetic sensor 10 (20) constitute the first to fourth resistor sections 11 to 14 (21 to 24). The numbers of the MR elements 30 that constitute the individual first to fourth resistor sections 11 to 14 (21 to 24) may be the same. To the power port V1 (V2), a predetermined voltage or current is applied. The ground port G is connected to a ground.

The first to fourth resistor sections 11 to 14 (21 to 24) constitute a Wheatstone bridge circuit. The first resistor section 11 (21) is provided between the power port V1 (V2) and the first output port E11 (E21). The second resistor section 12 (22) is provided between the ground port G and the first output port E11 (E21). The third resistor section 13 (23) is provided between the ground port G and the second output port E12 (E22). The fourth resistor section 14 (24) is provided between the power port V1 (V2) and the second output port E12 (E22). The Wheatstone bridge circuit includes a half-bridge circuit constituted of the first and second resistor sections 11 and 12 (21 and 22) and a half-bridge circuit constituted of the third and fourth resistor sections 13 and 14 (23 and 24).

The circuit configuration of the second magnetic sensor 20 is different from that of the first magnetic sensor 10 in the following matters. The first resistor section 21 includes two partial resistor sections 21A and 21B. The partial resistor sections 21A and 21B are connected in this order in series from the side of the power port V2. The second resistor section 22 includes two partial resistor sections 22A and 22B. The partial resistor sections 22A and 22B are connected in this order in series from the side of the first output port E21.

In the present embodiment, the MR element 30 is specifically a spin-valve MR element. The spin-valve MR element includes a magnetization pinned layer having a magnetization whose direction is fixed, a free layer having a magnetization whose direction is variable depending on the direction of a target magnetic field MF, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In each MR element 30, the free layer has a shape anisotropy that sets the direction of the magnetization easy axis to be orthogonal to the magnetization direction of the magnetization pinned layer.

In FIGS. 2 and 3, the filled arrows indicate the magnetization directions of the magnetization pinned layers of the MR elements 30. In the example shown in FIGS. 2 and 3, the magnetization pinned layers of the MR elements 30 in the first and third resistor sections 11 and 13 of the first magnetic sensor 10 have magnetizations in the X direction, and the magnetization pinned layers of the MR elements 30 in the second and fourth resistor sections 12 and 14 of the first magnetic sensor 10 have magnetizations in the −X direction. As shown in FIG. 4, in the first magnetic sensor 10, the planar shape of each of the plurality of MR elements 30 is a rectangle that is long in a direction parallel to the Y direction. Thereby, the direction of the magnetization easy axis of the free layer of each MR element 30 is a direction parallel to the Y direction.

The potential difference between the first output port E11 and the second output port E12 of the first magnetic sensor 10 has a correspondence with the strength of the component of the target magnetic field MF in the X direction at the reference position. The first magnetic sensor 10 generates the first detection signal S1 corresponding to the potential difference between the first output port E11 and the second output port E12. The first detection signal S1 may be one obtained by adjusting the amplitude or offset of the potential difference between the first output port E11 and the second output port E12.

The magnetization directions of the magnetization pinned layers of the MR elements 30 in the partial resistor sections 21A and 21B and the third resistor section 23 of the second magnetic sensor 20 are in the Y direction. The magnetization directions of the magnetization pinned layers of the MR elements 30 in the partial resistor sections 22A and 22B and the fourth resistor section 24 of the second magnetic sensor 20 are in the −Y direction. As shown in FIG. 6, in the second magnetic sensor 20, the planar shape of each of the plurality of MR elements 30 is a rectangle that is long in a direction parallel to the X direction. Thereby, the direction of the magnetization easy axis of the free layer of each MR element 30 is a direction parallel to the X direction.

The potential difference between the first output port E21 and the second output port E22 of the second magnetic sensor 20 has a correspondence with the strength of the component of the target magnetic field MF in the Y direction at the reference position. The second magnetic sensor 20 generates the second detection signal S2 corresponding to the potential difference between the first output port E21 and the second output port E22. The second detection signal S2 may be one obtained by adjusting the amplitude or offset of the potential difference between the first output port E21 and the second output port E22.

The strength of each of the component of the target magnetic field MF in the X direction and a component of the target magnetic field MF in the Y direction has a correspondence with the direction of the target magnetic field MF, and the direction of the target magnetic field MF has a correspondence with the relative position, in particular, the rotational position of the magnetic field generator 5 with respect to the magnetic sensor device 1. Therefore, each of the first and second detection signals S1 and S2 has a correspondence with the rotational position.

Each of the first and second magnetic sensors 10 and 20 further includes a plurality of lower electrodes 41 and a plurality of upper electrodes 42 to electrically connect the plurality of MR elements 30. As shown in FIG. 5, the plurality of lower electrodes 41 of the first magnetic sensor 10 are located on the top surface of the insulating layer 53, i.e., on the second surface 50b of the support member 50. As shown in FIG. 7, the plurality of lower electrodes 41 of the second magnetic sensor 20 are located on the top surface of the insulating layer 52, i.e., on the first surface 50a of the support member 50.

As shown in FIGS. 5 and 7, the magnetic sensor device 1 further includes insulating layers 54, 55, and 56. The insulating layer 54 is located around the plurality of lower electrodes 41 on the insulating layer 52 or the insulating layer 53. The plurality of MR elements 30 are located on the plurality of lower electrodes 41. The insulating layer 55 is located around the plurality of MR elements 30 on the plurality of lower electrodes 41 and the insulating layer 54. The plurality of upper electrodes 42 are located on the plurality of MR elements 30 and the insulating layer 55. The insulating layer 56 is located around the plurality of upper electrodes 42 on the insulating layer 55.

The plurality of lower electrodes 41 and the plurality of upper electrodes 42 are made of a conductive material such as Cu. The insulating layers 54 to 56 are made of an insulating material such as $SiO_2$, for example. In FIGS. 4 and 6, the lower electrodes 41, the upper electrodes 42, and the insulating layers 54 to 56 are omitted.

The magnetic sensor device 1 may be further provided with a processor that generates a detection value having a correspondence with the rotational position based on the first and second detection signals S1 and S2. The processor may generate a value θs, as the foregoing detection value, which represents an angle formed by the direction of the target magnetic field MF at the predetermined reference position with respect to a predetermined reference direction. In such a case, the processor determines the value θs by calculating the arctangent of the ratio of a value of the second detection signal S2 to a value of the first detection signal S1, for example.

The processor can be embodied by an application specific integrated circuit (ASIC) or a microcomputer, for example. The processor may be integrated with the first and second magnetic sensors 10 and 20, or may be separated from the first and second magnetic sensors 10 and 20.

Next, a manufacturing method for a magnetic sensor device 1 will be described. The following description includes a description about a manufacturing method for first and second magnetic sensors 10 and 20. The manufacturing method for the magnetic sensor device 1 includes a step of manufacturing a fundamental structure in which initial magnetic sensor devices each to be the magnetic sensor device 1 are arranged in a plurality of rows by forming component elements, exclusive of substrates 51, of a plurality of the magnetic sensor devices 1 on a wafer W, which includes portions to be the substrates 51 of the plurality of the magnetic sensor devices 1; and a step of dividing the plurality of the initial magnetic sensor devices from one another by dicing the fundamental structure. The plurality of the magnetic sensor devices 1 are thus manufactured.

Figure 8:
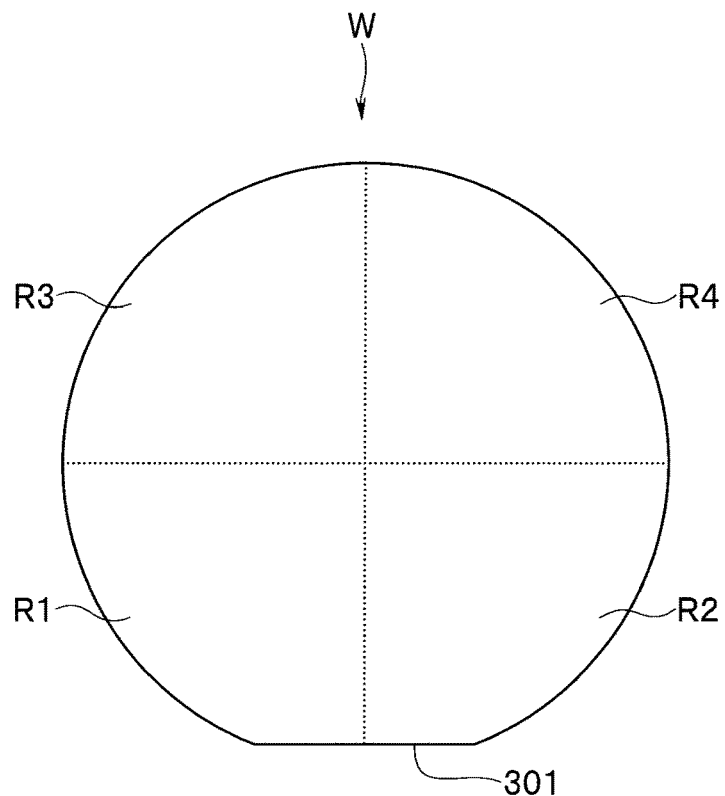
FIG. 8 is a plan view showing a wafer used for manufacturing the magnetic sensor device of the first embodiment of the invention.

FIG. 8 is a plan view showing a top surface of the wafer W. The wafer W has a cutout 301, such as an orientation flat, formed at a part of an edge of the wafer W. FIG. 8 shows the top surface of the wafer W in a posture such that the cutout 301 is oriented downward in FIG. 8.

As shown in FIG. 8, the top surface of the wafer W is divided into four regions R1, R2, R3, and R4. The regions R1 and R2 include the cutout 301, and the regions R3 and R4 do not include the cutout 301. The region R1 is positioned on a lower left side in FIG. 8. The region R2 is positioned on a lower right side in FIG. 8. The region R3 is positioned on an upper left side in FIG. 8. The region R4 is positioned on an upper right side in FIG. 8. The magnetic sensor devices 1 of a first type are formed in the region R1. The magnetic sensor devices 1 of a second type are formed in the region R2. The magnetic sensor devices 1 of a third type are formed in the region R3. The magnetic sensor devices 1 of a fourth type are formed in the region R4. The magnetic sensor devices 1 of the first to fourth types will be described later in detail.

Figure 9:
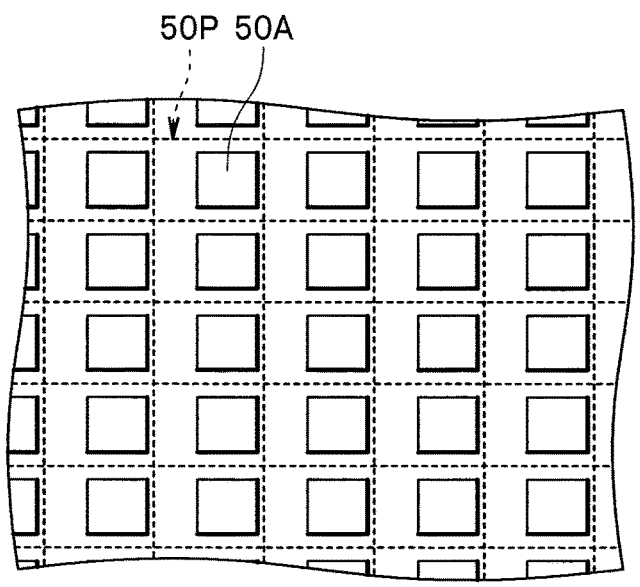
FIG. 9 is a plan view showing a part of a top surface of a laminate in a step of manufacturing a fundamental structure of the first embodiment of the invention.
Figure 9:
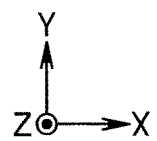

The step of manufacturing the fundamental structure includes a step of forming an insulating layer 52 on the entire top surface of the wafer W, and a step of forming a plurality of insulating layers 53 on the insulating layer 52. FIG. 9 is a plan view showing a part of a top surface of a laminate in the step of manufacturing the fundamental structure. FIG. 9 shows the part of the top surface of the laminate in which the insulating layers 52 and 53 are formed on the top surface of the wafer W.

The laminate contains a plurality of initial support members 50P each to be the support member 50. Each of the plurality of initial support members 50P has a stepped section 50A.

Figure 10:
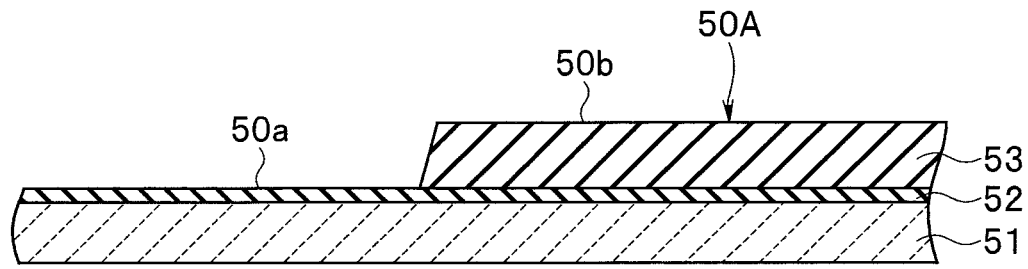
FIG. 10 is a sectional view showing a step of a manufacturing method for the magnetic sensor device of the first embodiment of the invention.

Focusing attention on the single initial support member 50P, the step of manufacturing the fundamental structure after formation of the insulating layer 53 will be described below. FIG. 10 shows a single step of the manufacturing method for the magnetic sensor device 1. FIG. 10 is a sectional view showing a part of the laminate in which the insulating layers 52 and 53 are formed on the top surface of the substrate 51. The laminate shown in FIG. 10 corresponds to a part of the laminate shown in FIG. 9.

Figure 11:
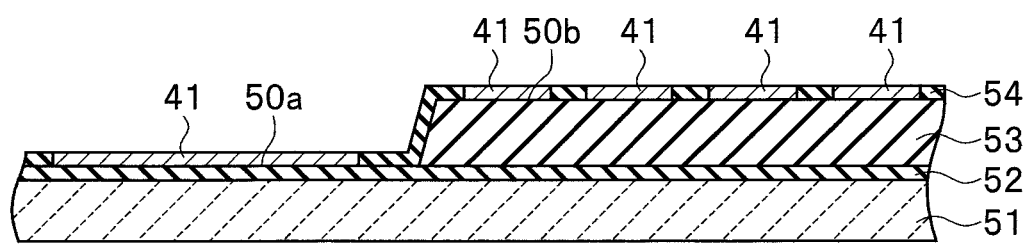
FIG. 11 is a sectional view showing a step that follows the step in FIG. 10.

FIG. 11 shows the next step. In this step, a plurality of the lower electrodes 41 are first formed on the top surfaces of the insulating layers 52 and 53. Then, the insulating layer 54 is formed around the plurality of lower electrodes 41.

Figure 12:
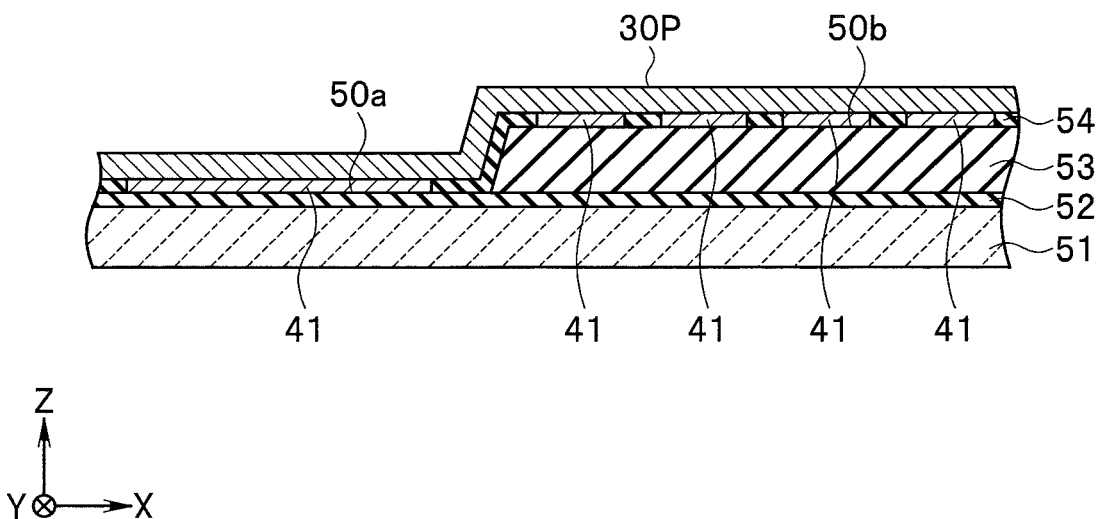
FIG. 12 is a sectional view showing a step that follows the step in FIG. 11.

FIG. 12 shows the next step. In this step, films to be layers constituting MR elements 30 are formed in sequence, to form a laminate film 30P to be the MR element 30 on the plurality of lower electrodes 41 and the insulating layer 54.

Figure 13:
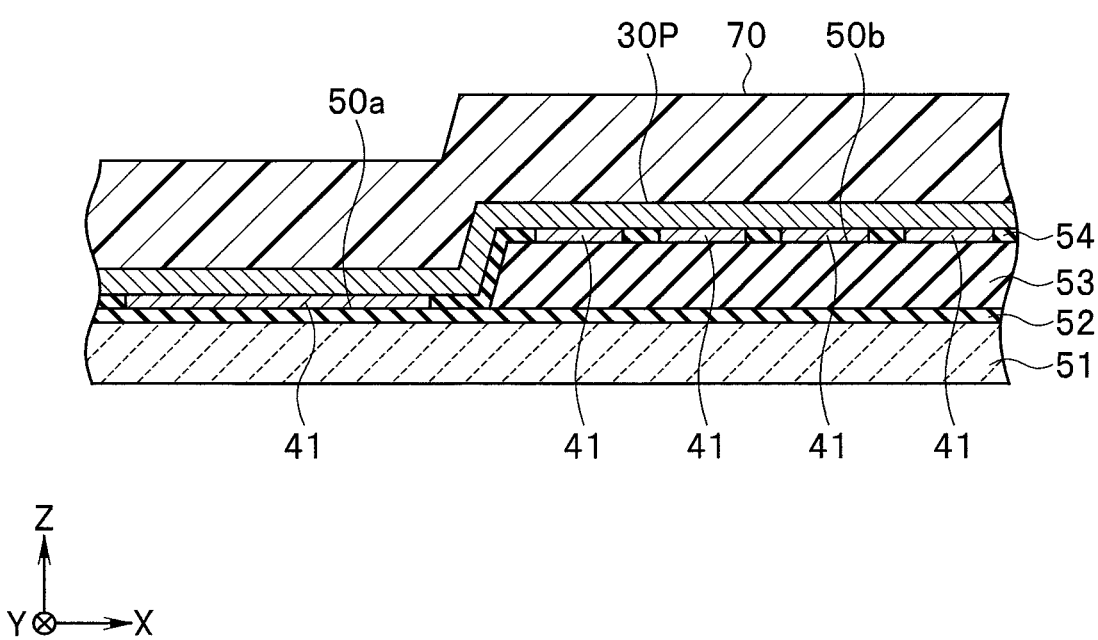
FIG. 13 is a sectional view showing a step that follows the step in FIG. 12.
Figure 14:
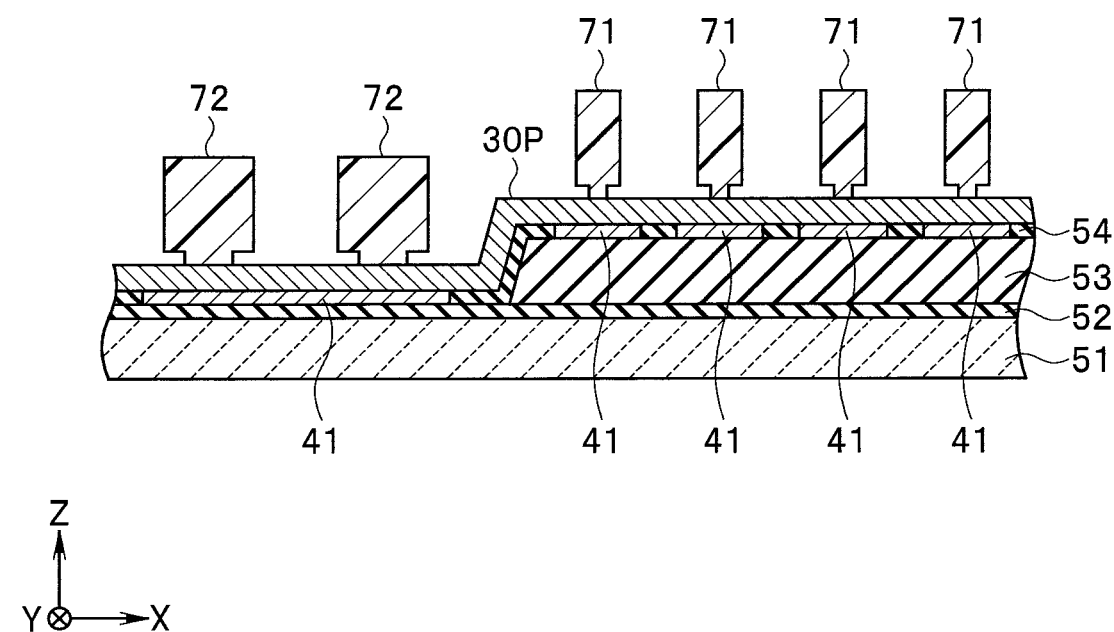
FIG. 14 is a sectional view showing a step that follows the step in FIG. 13.

FIG. 13 shows the next step. In this step, a photoresist layer 70 is formed on the laminate film 30P. Then, as shown in FIG. 14, a plurality of etching masks 71 to form a plurality of MR elements 30 of the first magnetic sensor 10 and a plurality of etching masks 72 to form a plurality of MR elements 30 of the second magnetic sensor 20 are formed by patterning the photoresist layer 70 by photolithography. As shown in FIG. 14, each of the etching masks 71 and 72 is preferably an etching mask having an undercut.

Figure 15:
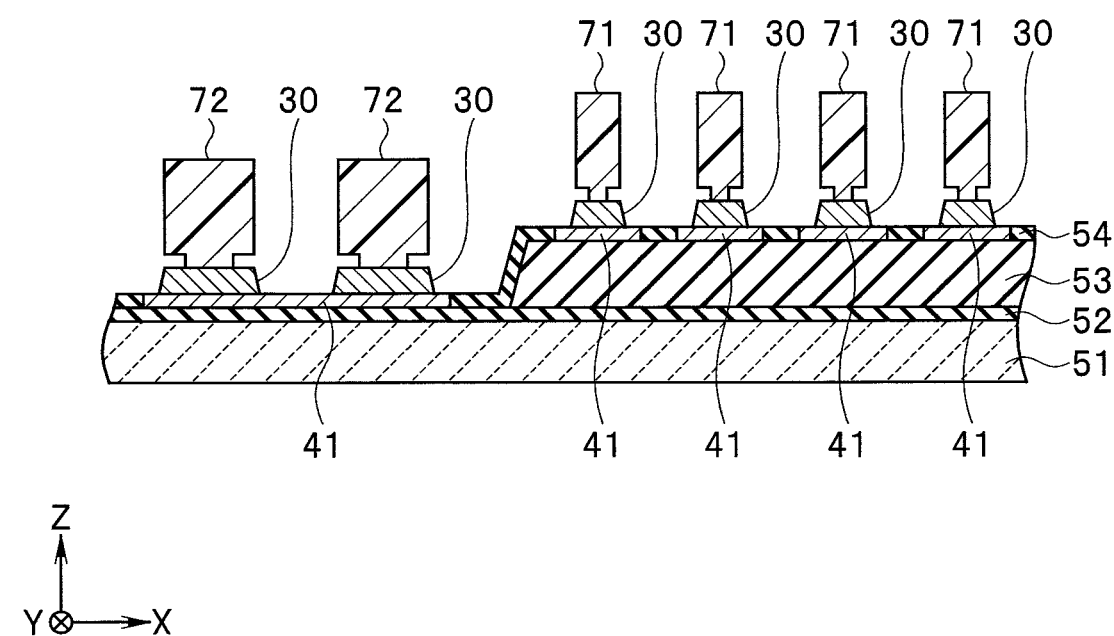
FIG. 15 is a sectional view showing a step that follows the step in FIG. 14.
Figure 16:
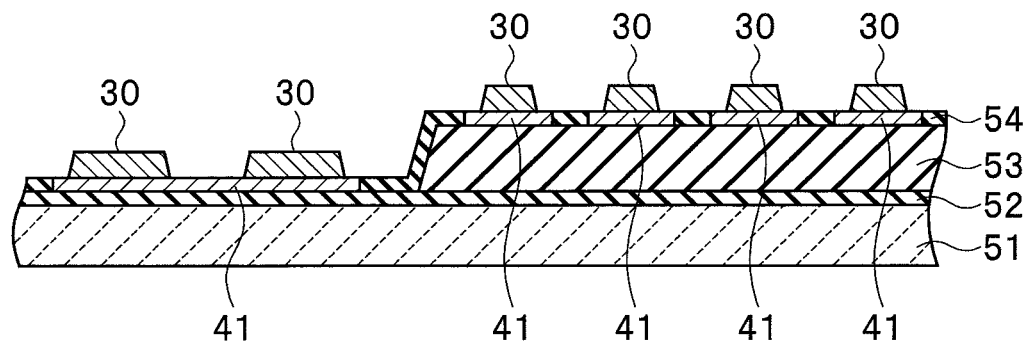
FIG. 16 is a sectional view showing a step that follows the step in FIG. 15.

FIG. 15 shows the next step. In this step, the laminate film 30P is etched by, for example, ion milling using the plurality of etching masks 71 and the plurality of etching masks 72. Thereby, the plurality of MR elements 30 of the first magnetic sensor 10 and the plurality of MR elements 30 of the second magnetic sensor 20 are formed. Then, as shown in FIG. 16, the plurality of etching masks 71 and the plurality of etching masks 72 are removed.

Figure 17:
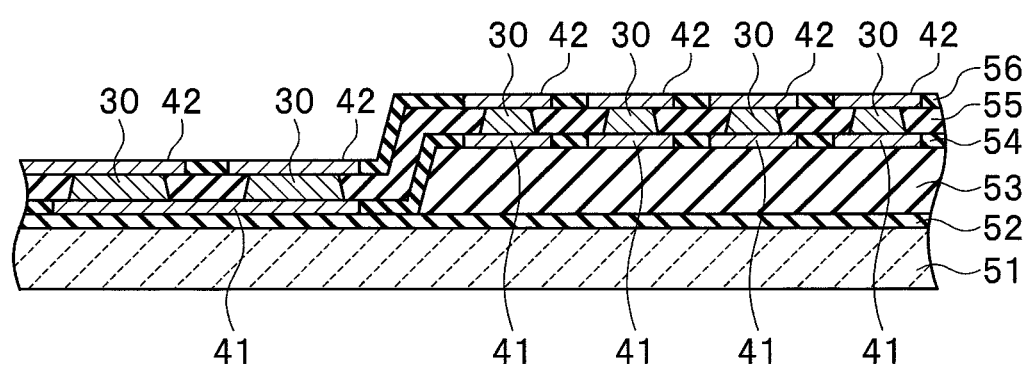
FIG. 17 is a sectional view showing a step that follows the step in FIG. 16.

FIG. 17 shows the next step. In this step, the insulating layer 55 is formed around the plurality of MR elements 30. Note that, after the plurality of MR elements 30 are formed, the insulating layer 55 may be formed with leaving the plurality of etching masks 71 and the plurality of etching masks 72. In such a case, after the insulating layer 55 is formed, the plurality of etching masks 71 and the plurality of etching masks 72 are removed.

In the step shown in FIG. 17, a plurality of upper electrodes 42 are formed on the plurality of MR elements 30 and the insulating layer 55. Then, an insulating layer 56 is formed around the plurality of upper electrodes 42. Thereby, initial magnetic sensor devices 1P are completed. Note that a not-shown insulating layer may be formed on the plurality of upper electrodes 42 and the insulating layer 56.

The plurality of initial magnetic sensor devices 1P are formed by the sequence of steps described with reference to FIGS. 9 to 17. The fundamental structure is completed thereby. After that, the plurality of initial magnetic sensor devices 1P are divided from one another to complete a plurality of the magnetic sensor devices 1.

Next, the physical arrangement of the first to fourth resistor sections 11 to 14 in the first magnetic sensor 10 and the physical arrangement of the partial resistor sections 21A, 21B, 22A, and 22B and the third and fourth resistor sections 23 and 24 in the second magnetic sensor 20 will be described. The first magnetic sensor 10 will be first described. In the first magnetic sensor 10, each of the plurality of MR elements 30 constituting the first to fourth resistor sections 11 to 14 belongs to any of a first group, a second group, a third group, and a fourth group, and one or more MR elements 30 of the plurality of MR elements 30 belong to each of the first to fourth groups.

In the first magnetic sensor 10, each of the plurality of MR elements 30 is located in any of a first region R11, a second region R12, a third region R13, and a fourth region R14 of the second surface 50b of the support member 50, and one or more MR elements 30 of the plurality of MR elements 30 are located in each of the first to fourth regions R11 to R14. A set of one or more MR elements 30 belonging to each group or each region is hereinafter referred to as an element group.

In the present embodiment, the first resistor section 11, the second resistor section 12, the third resistor section 13, and the fourth resistor section 14 are constituted of a first group, a second group, a third group, and a fourth group, and are constituted of an element group in the third region R13, an element group in the first region R11, an element group in the second region R12, and an element group in the fourth region R14, respectively. An element group of the first group (first resistor section 11) is located in the third region R13. An element group of the second group (second resistor section 12) is located in the first region R11. An element group of the third group (third resistor section 13) is located in the second region R12. An element group of the fourth group (fourth resistor section 14) is located in the fourth region R14.

The first to fourth regions R11 to R14 are arranged with respect to a reference portion, which is a part of an outer edge of the stepped section 50A of the support member 50. As described above, in the present embodiment, the first to fourth types of the magnetic sensor devices 1 are manufactured from the single wafer W. The arrangement of the first to fourth regions R11 to R14 is different from one type of the magnetic sensor device 1 to another.

FIGS. 18 to 21 are explanatory diagrams of the arrangement of the plurality of MR elements 30 included in the first to fourth types of the magnetic sensor devices 1, respectively. In FIGS. 18 to 21, a symbol Ea indicates a portion at an end of the outer edge of the stepped section 50A of the support member 50 in the −Y direction, and a symbol Eb indicates a portion at an end of the outer edge in the −X direction.

In the first magnetic sensor 10, the portion Ea corresponds to the "reference portion". Here, a first virtual straight line L1 is assumed. The straight line L1 is orthogonal to a direction perpendicular to the first surface 50a and along the portion Ea while intersecting at least a part of the portion Ea. The portion Ea and the first virtual straight line L1 extend along a direction parallel to the X direction. The first to fourth regions R11 to R14 are aligned along the first virtual straight line L1.

Figure 18:
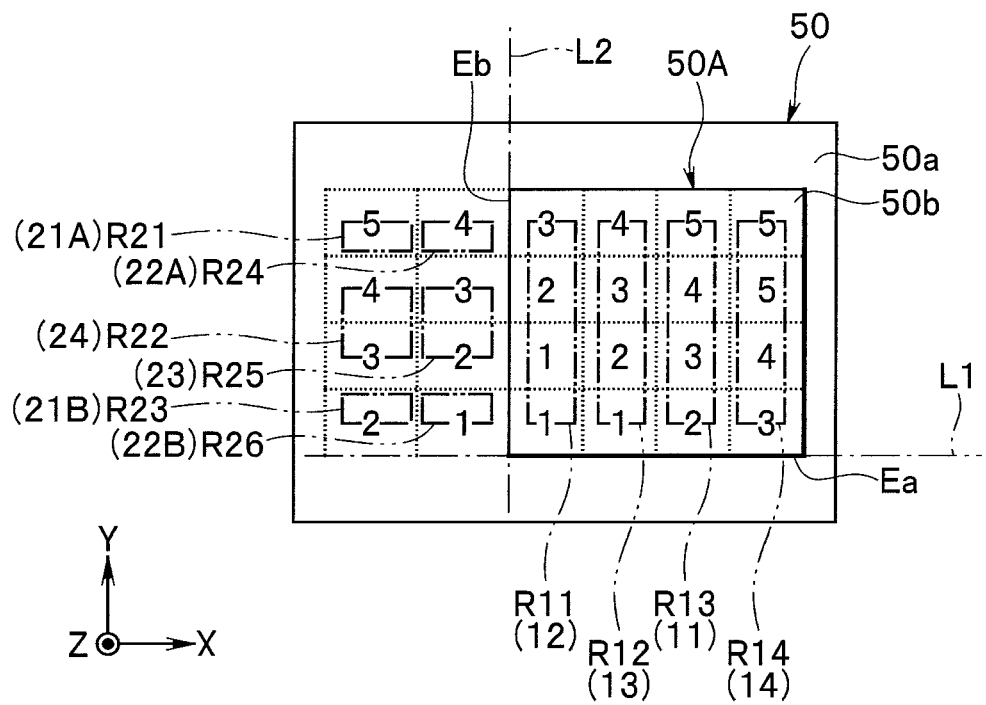
FIG. 18 is an explanatory diagram of the arrangement of a plurality of magnetoresistive elements included in the magnetic sensor device of a first type according to the first embodiment of the invention.
Figure 19:
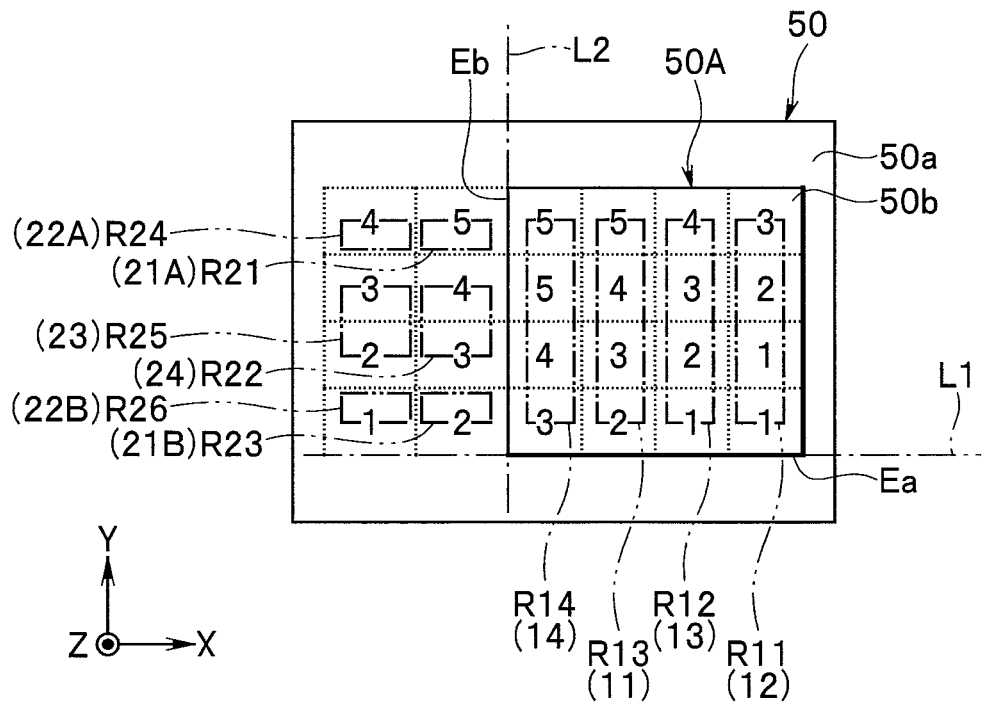
FIG. 19 is an explanatory diagram of the arrangement of a plurality of magnetoresistive elements included in the magnetic sensor device of a second type according to the first embodiment of the invention.
Figure 20:
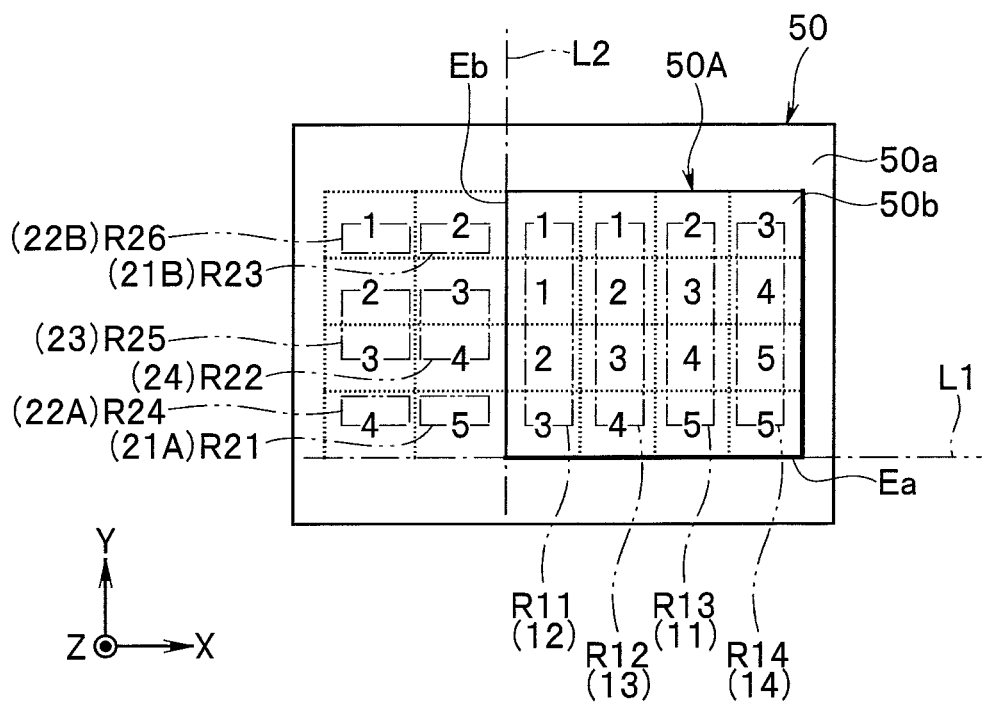
FIG. 20 is an explanatory diagram of the arrangement of a plurality of magnetoresistive elements included in the magnetic sensor device of a third type according to the first embodiment of the invention.
Figure 21:
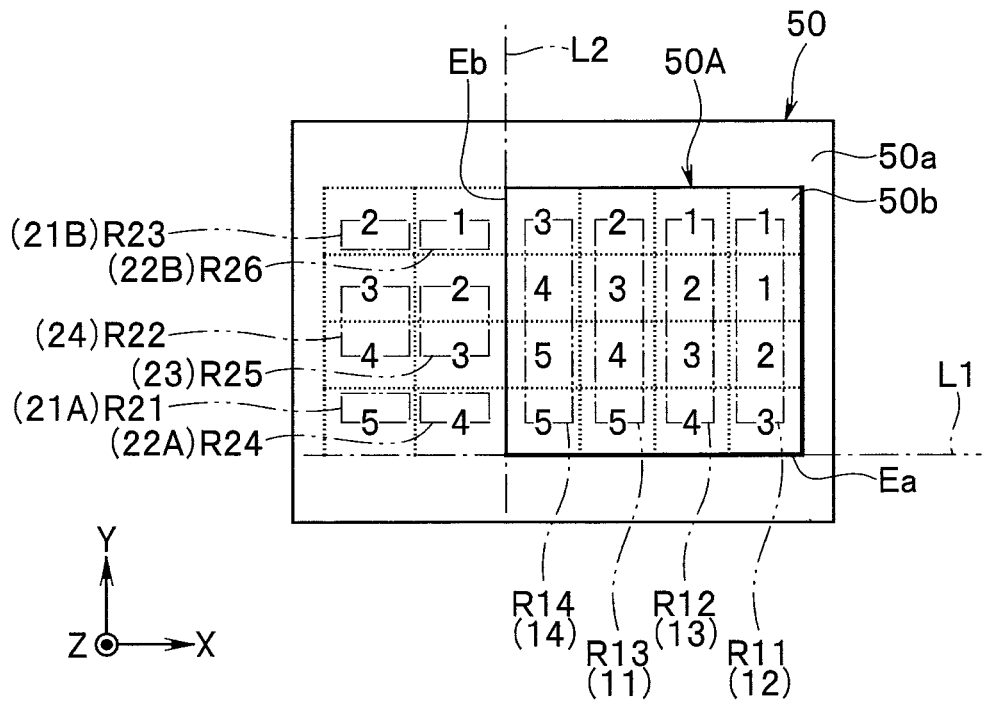
FIG. 21 is an explanatory diagram of the arrangement of a plurality of magnetoresistive elements included in the magnetic sensor device of a fourth type according to the first embodiment of the invention.

As shown in FIGS. 18 to 21, the arrangement of the first to fourth resistor sections 11 to 14, i.e., the arrangement of the first to fourth regions R11 to R14 is different from one type of the magnetic sensor device 1 to another. For example, as shown in FIG. 18, in the first type of magnetic sensor device 1, the first to fourth regions R11 to R14 are arranged in this order in the X direction. FIG. 3 shows the first type of magnetic sensor device 1.

Next, the second magnetic sensor 20 will be described. In the second magnetic sensor 20, each of the plurality of MR elements 30 constituting the first to fourth resistor sections 21 to 24 belongs to any of a first group, a second group, a third group, and a fourth group, and a set of one or more MR elements 30 of the plurality of MR elements 30, i.e., an element group belongs to each of the first to fourth groups.

In the second magnetic sensor 20, in particular, two or more MR elements 30 belong to each of the first and second groups. The first group includes first and second sub groups. The second group includes third and fourth sub groups. To each of the first to fourth sub groups, a set of one or more MR elements 30, i.e., an element group belongs.

In the second magnetic sensor 20, each of the plurality of MR elements 30 is located in any of a first region R21, a second region R22, a third region R23, and another region that is other than the first to third regions R21 to R23 of the first surface 50a of the support member 50. A set of one or more MR elements 30 of the plurality of MR elements 30, i.e., an element group is located in each of the first to third regions R21 to R23.

In the foregoing other region, two or more MR elements 30 of the plurality of MR elements 30 are located. In the present embodiment, in particular, the foregoing other region includes a fourth region R24, a fifth region R25, and a sixth region R26. An element group is located in each of the fourth to sixth regions R24 to R26.

The element group in the first region R21 and the element group in the third region R23 constitute a divided resistor section. The element group in the second region R22 constitutes an undivided resistor section. In the present embodiment, in particular, the element group in the first region R21 and the element group in the third region R23 constitute a first divided resistor section as the foregoing divided resistor section. The element group in the fourth region R24 and the element group in the sixth region R26 constitute a second divided resistor section. The element group in the fifth region R25 constitutes a first undivided resistor section. The element group in the second region R22 constitutes a second undivided resistor section as the foregoing undivided resistor section.

In the present embodiment, the first resistor section 21, the second resistor section 22, the third resistor section 23, and the fourth resistor section 24 are constituted of the first group, the second group, the third group, and the fourth group, respectively, and correspond to the first divided resistor section, the second divided resistor section, the first undivided resistor section, and the second undivided resistor section, respectively.

The partial resistor section 21A of the first resistor section 21 is constituted of the element group of the first sub group. The element group of the first sub group (partial resistor section 21A) is located in the first region R21.

The partial resistor section 21B of the first resistor section 21 is constituted of the element group of the second sub group. The element group of the second sub group (partial resistor section 21B) is located in the third region R23.

The partial resistor section 22A of the second resistor section 22 is constituted of the element group of the third sub group. The element group of the third sub group (partial resistor section 22A) is located in the fourth region R24.

The partial resistor section 22B of the second resistor section 22 is constituted of the element group of the fourth sub group. The element group of the fourth sub group (partial resistor section 22B) is located in the sixth region R26.

The element group of the third group (third resistor section 23) is located in the fifth region R25. The element group of the fourth group (fourth resistor section 24) is located in the second region R22.

The first to third regions R21 to R23 are arranged with respect to a reference portion, which is a part of an outer edge of the stepped section 50A of the support member 50. The fourth to sixth regions R24 to R26 are arranged with respect to the foregoing reference portion, at different positions from the first to third regions R21 to R23. The arrangement of the first to sixth regions R21 to R26 is different from one type of the magnetic sensor device 1 to another.

In the second magnetic sensor 20, a portion Eb positioned at an end in the −X direction of the outer edge of the stepped section 50A of the support member 50 corresponds to the "reference portion". Here, a second virtual straight line L2 is assumed. The second virtual straight line L2 is orthogonal to a direction perpendicular to the first surface 50a and along the portion Eb while intersecting at least a part of the portion Eb. The portion Eb and the second virtual straight line L2 extend along a direction parallel to the Y direction. The first to third regions R21 to R23 are arranged along the second virtual straight line L2.

The fourth to sixth regions R24 to R26 are located at different positions from the first to third regions R21 to R23 in a direction being orthogonal to a direction perpendicular to the first surface 50a and intersecting the second virtual straight line L2. In the present embodiment, the fourth to sixth regions R24 to R26 are located at different positions from the first to third regions R21 to R23 in a direction parallel to the X direction. The fourth to sixth regions R24 to R26 are arranged along the second virtual straight line L2.

As shown in FIGS. 18 to 21, the arrangement of the partial resistor sections 21A, 21B, 22A, and 22B and the third and fourth resistor sections 23 and 24, i.e., the arrangement of the first to sixth regions R21 to R26 is different from one type of the magnetic sensor device 1 to another. For example, as shown in FIG. 18, in the first type of magnetic sensor device 1, the first to third regions R21 to R23 are arranged in this order in the −Y direction. The fourth to sixth regions R24 to R26 are arranged in this order in the −Y direction on a front side of the first to third regions R21 to R23 in the X direction.

Next, the difference between the MR elements 30 belonging to the individual groups will be described. In the present embodiment, each group is defined based on the areas of the top surfaces 30*a* of the MR elements 30. First, the definition of each group in the first magnetic sensor 10 will be described. In the first magnetic sensor 10, each group is defined so as to satisfy the following first to third requirements. The first requirement is that an average area of the top surfaces 30*a* of the MR elements 30 belonging to the third group is larger than an average area of the top surfaces 30*a* of the MR elements 30 belonging to the second group. The second requirement is that an average area of the top surfaces 30*a* of the MR elements 30 belonging to the first group is larger than the average area of the top surfaces 30*a* of the MR elements 30 belonging to the third group. The third requirement is that an average area of the top surfaces 30*a* of the MR elements 30 belonging to the fourth group is larger than the average area of the top surfaces 30*a* of the MR elements 30 belonging to the first group.

Next, the definition of each group in the second magnetic sensor 20 will be described. In the second magnetic sensor 20, each group is defined so as to satisfy the following first to sixth requirements. The first requirement is that, when comparing between the areas of the top surfaces 30*a* of the individual MR elements 30, a maximum area of the top surfaces 30*a* of the MR elements 30 belonging to the first group is larger than areas of the top surfaces 30*a* of all of the MR elements 30 belonging to the second to fourth groups. The second requirement is that, when comparing between the areas of the top surfaces 30*a* of the individual MR elements 30, a minimum area of the top surfaces 30*a* of the MR elements 30 belonging to the second group is smaller than areas of the top surfaces 30*a* of all of the MR elements 30 belonging to the first, third, and fourth groups. The third requirement is that an average area of the top surfaces 30*a* of the MR elements 30 belonging to the third group is smaller than an average area of the top surfaces 30*a* of the MR elements 30 belonging to the fourth group.

The fourth requirement is that an average area of the top surfaces 30*a* of the MR elements 30 belonging to the second sub group is larger than an average area of the top surfaces 30*a* of the MR elements 30 belonging to the fourth sub group. The fifth requirement is that an average area of the top surfaces 30*a* of the MR elements 30 belonging to the third sub group is larger than an average area of the top surfaces 30*a* of the MR elements 30 belonging to the second sub group. The sixth requirement is that an average area of the top surfaces 30*a* of the MR elements 30 belonging to the first sub group is larger than an average area of the top surfaces 30*a* of the MR elements 30 belonging to the third sub group.

Next, the relationship between the area of the top surface 30*a* of the MR element 30 and the etching mask 71 or 72 will be described. The area of the top surface 30*a* of the MR element 30 depends on the dimensions of the etching mask 71 or 72, used in patterning of the MR element 30, in the X direction, the Y direction, and the Z direction. The smaller these dimensions, the smaller the area of the top surface 30*a* of the MR element 30.

The dimension (thickness) of the photoresist layer 70 in the Z direction affects the dimensions of the etching mask 71 or 72 in the X direction, the Y direction, and the Z direction.

To facilitate understanding, the relationship between the photoresist layer 70 and the etching mask 71 or 72 is simplified in the following description. In other words, the influences of the thickness of the photoresist layer 70 on the dimensions of the etching mask 71 or 72 in the X direction and the Y direction are ignored here. In this condition, the area of the top surface 30*a* of the MR element 30 decreases with reduction in the thickness of the photoresist layer 70.

In FIGS. 18 to 21, each of the first surface 50*a* and the second surface 50*b* of the support member 50 is partitioned by dotted lines into a plurality of sections. A number accompanying each of the plurality of sections is an index indicating an average value of the thickness of the photoresist layer 70 in the section. In FIGS. 18 to 21, the average value of the thickness of the photoresist layer 70 in each section is represented by numbers of 1 to 5 in such a manner that a section having a minimum average value of the thickness of the photoresist layer 70 is indicated with 1 and a section having a maximum average value of the thickness of the photoresist layer 70 is indicated with 5. By way of example, if the average value of the thickness of the photoresist layer 70 having an index of "3" is set as a reference value, the average value of the thickness of the photoresist layer 70 having an index of "1" is 65% of the reference value, the average value of the thickness of the photoresist layer 70 having an index of "2" is 80% of the reference value, the average value of the thickness of the photoresist layer 70 having an index of "4" is 125% of the reference value, and the average value of the thickness of the photoresist layer 70 having an index of "5" is 155% of the reference value.

Note that, in the drawings similar to FIGS. 18 to 21 used in the following description, the thickness of the photoresist layer 70 is represented in the same manner as in FIGS. 18 to 21.

As shown in FIGS. 18 to 21, the reason why the thickness of the photoresist layer 70 varies according to the position is that the support member 50 has the stepped section 50A. That is, in applying a photoresist to form the photoresist layer 70, the stepped section 50A functions as resistance and hence disturbs a flow of the photoresist. Thereby, the thickness of the photoresist layer 70 becomes uneven.

The inventors of the present application have found that variation in the thickness of the photoresist layer 70 exhibits an almost constant tendency in each of the four regions R1 to R4 of the top surface of the wafer W shown in FIG. 8. In the present embodiment, the magnetic sensor device 1 is sorted into the first to fourth types based on the regions R1 to R4, in other words, based on the tendency relating to the variation in the thickness of the photoresist layer 70. The indexes shown in FIGS. 18 to 21 indicate the tendency relating to the variation in the thickness of the photoresist layer 70.

As described above, the area of the top surface 30*a* of the MR element 30 decreases with reduction in the thickness of the photoresist layer 70. As a result, the dimensions of the MR element 30 in the X direction and the Y direction are also reduced. A longer one of the dimensions of the MR element 30 in the X direction and the Y direction is hereinafter referred to as a dimension in a long-axial direction, and a shorter one is hereinafter referred to as a dimension in a short-axial direction. As an example, the dimension of the MR element 30 in the short-axial direction is 0.8 µm when the index is "1", 0.9 µm when the index is "2", 1.0 µm when the index is "3", 1.1 µm when the index is "4", and 1.2 µm when the index is "5".

Next, the operation and effects of the magnetic sensors 10 and 20 according to the present embodiment will be described. Here, the deviation of each of the first and second detection signals S1 and S2 from a predetermined reference value, when no external magnetic field is applied to the magnetic sensor device 1, is referred to as an offset. The resistance of the MR element 30 when no external magnetic field is applied to the magnetic sensor device 1 is indirectly proportional to the area of the top surface 30a of the MR element 30. According to the first magnetic sensor 10 of the present embodiment, it is possible to reduce the offset of the first detection signal S1 by defining the first to fourth groups based on the areas of the top surfaces 30a of the MR elements 30 as described above. Similarly, according to the second magnetic sensor 20 of the present embodiment, it is possible to reduce the offset of the second detection signal S2 by defining the first to fourth sub groups and the third and fourth groups based on the areas of the top surfaces 30a of the MR elements 30 as described above.

The effects of the magnetic sensors 10 and 20 according to the present embodiment will be hereinafter described, with comparison with a magnetic sensor device according to a comparative example. By way of example, the first type of magnetic sensor device 1 will be described here. In the following description, it is assumed that a plurality of the MR elements 30 are located in each of the plurality of sections shown in FIG. 18.

First, the configuration of the magnetic sensor device according to the comparative example will be described. The configuration of the magnetic sensor device according to the comparative example is basically the same as that of the first type of magnetic sensor device 1. The magnetic sensor device according to the comparative example includes first and second magnetic sensors according to the comparative example, instead of the first and second magnetic sensors 10 and 20. The configuration of the first magnetic sensor according to the comparative example is basically the same as that of the first magnetic sensor 10. The configuration of the second magnetic sensor according to the comparative example is basically the same as that of the second magnetic sensor 20.

Figure 22:
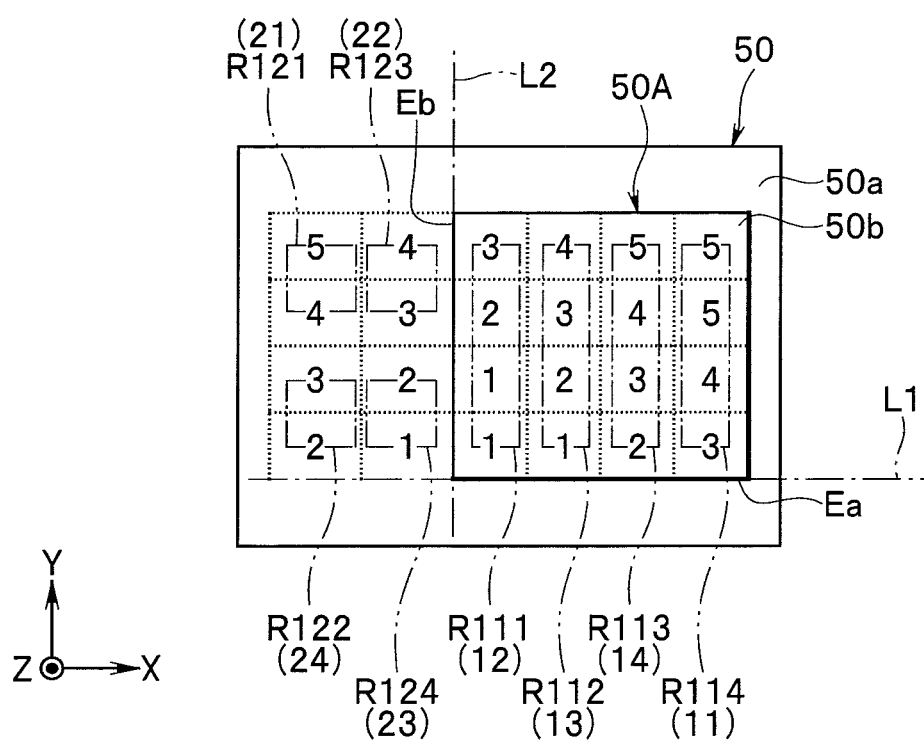
FIG. 22 is an explanatory diagram of the arrangement of magnetoresistive elements included in a magnetic sensor device according to a comparative example.

In the first and second magnetic sensors according to the comparative example, the position of each resistor section is different from that of the first and second magnetic sensors 10 and 20. FIG. 22 is an explanatory diagram of the arrangement of a plurality of MR elements 30 included in the magnetic sensor device according to the comparative example. In the first magnetic sensor according to the comparative example, each of the plurality of MR elements 30 is located in any of a first region R111, a second region R112, a third region R113, and a fourth region R114 of the second surface 50b of the support member 50, and a set of a plurality of MR elements 30, i.e., an element group is located in each of the first to fourth regions R111 to R114.

In the first magnetic sensor according to the comparative example, the first resistor section 11 is constituted of the element group in the fourth region R114. The second resistor section 12 is constituted of the element group in the first region R111. The third resistor section 13 is constituted of the element group in the second region R112. The fourth resistor section 14 is constituted of the element group in the third region R113. The first to fourth regions R111 to R114 are arranged in this order in the X direction. Accordingly, in the first magnetic sensor according to the comparative example, the second resistor section 12, the third resistor section 13, the fourth resistor section 14, and the first resistor section 11 are arranged in this order in the X direction.

In the second magnetic sensor according to the comparative example, each of the plurality of MR elements 30 is located in any of a first region R121, a second region R122, a third region R123, and a fourth region R124 of the first surface 50a of the support member 50, and a set of a plurality of MR elements 30, i.e., an element group is located in each of the first to fourth regions R121 to R124.

In the second magnetic sensor according to the comparative example, the first resistor section 21 is constituted of the element group in the first region R121. The second resistor section 22 is constituted of the element group in the third region R123. The third resistor section 23 is constituted of the element group in the fourth region R124. The fourth resistor section 24 is constituted of the element group in the second region R122.

The first and second regions R121 and R122 are arranged in this order in the −Y direction. The third and fourth regions R123 and R124 are arranged in this order in the −Y direction on a front side of the first and second regions R121 and R122 in the X direction. Therefore, in the second magnetic sensor according to the comparative example, the first and fourth resistor sections 21 and 24 are arranged in this order in the −Y direction, and the second and third resistor sections 22 and 23 are arranged in this order in the −Y direction, on a front side of the first and fourth resistor sections 21 and 24 in the X direction.

Next, the offset of the first detection signal S1 generated by each of the first magnetic sensor 10 and the first magnetic sensor according to the comparative example will be described. Here, a symbol Ra represents the resistance of the first resistor section 11, a symbol Rb represents the resistance of the second resistor section 12, a symbol Rc represents the resistance of the third resistor section 13, and Rd represents the resistance of the fourth resistor section 14. When a symbol E represents a voltage value applied to the power port V1, the electric potential E1 of the first output port E11 is represented by the following expression (1).

$$E1 = E \times Rb/(Ra+Rb) \tag{1}$$

The electric potential E2 of the second output port E12 is represented by the following expression (2).

$$E2 = E \times Rc/(Rc+Rd) \tag{2}$$

Here, if the dimension of the MR element 30 in the long-axial direction is assumed to be constant, the area of the top surface 30a of the MR element 30 is directly proportional to the dimension of the MR element 30 in the short-axial direction, and the resistance of the MR element 30, when no external magnetic field is applied to the magnetic sensor device 1, is indirectly proportional to the dimension of the MR element 30 in the short-axial direction. Accordingly, with the use of an example of the foregoing dimension of the MR element 30 in the short-axial direction, the sum of the resistances of the plurality of MR elements 30 located in each of the plurality of sections shown in FIG. 18 (hereinafter referred to as section resistance) is defined as follows. In the case where no external magnetic field is applied to the magnetic sensor device 1, the section resistance is R/0.8, i.e., 1.25R when the index is "1", R/0.9, i.e., 1.11R when the index is "2", R when the index is "3", R/1.1, i.e., 0.91R when the index is "4", and R/1.2, i.e., 0.83R when the index is "5".

The sum of the resistances of the plurality of MR elements 30 located in each region shown in FIG. 18 (hereinafter referred to as region resistance) is the sum of the section resistances of a plurality of sections overlapping the region. When no external magnetic field is applied to the magnetic sensor device 1, the region resistance of the first region R11 is 4.61R, the region resistance of the second region R12 is 4.27R, the region resistance of the third region R13 is 3.85R, and the region resistance of the fourth region R14 is 3.57R.

In the first magnetic sensor 10, when no external magnetic field is applied to the magnetic sensor device 1, the resistance Ra of the first resistor section 11 corresponds to the region resistance of the third region R13, i.e., 3.85R, the resistance Rb of the second resistor section 12 corresponds to the region resistance of the first region R11, i.e., 4.61R, the resistance Rc of the third resistor section 13 corresponds to the region resistance of the second region R12, i.e., 4.27R, and the resistance Rd of the fourth resistor section 14 corresponds to the region resistance of the fourth region R14, i.e., 3.57R.

In the first magnetic sensor 10, according to the expression (1), the electric potential E1 of the first output port E11, when no external magnetic field is applied to the magnetic sensor device 1, is 0.545E. According to the expression (2), the electric potential E2 of the second output port E12, when no external magnetic field is applied to the magnetic sensor device 1, is 0.545E. Accordingly, when no external magnetic field is applied to the magnetic sensor device 1, the potential difference between the first output port E11 and the second output port E12 is 0.

The region resistance of each of the first to fourth regions R111 to R114 shown in FIG. 22 is as follows. When no external magnetic field is applied to the magnetic sensor device 1, the region resistance of the first region R111 is 4.61R, the region resistance of the second region R112 is 4.27R, the region resistance of the third region R113 is 3.85R, and the region resistance of the fourth region R114 is 3.57R.

In the first magnetic sensor according to the comparative example, when no external magnetic field is applied to the magnetic sensor device according to the comparative example, the resistance Ra of the first resistor section 11 corresponds to the region resistance of the fourth region R114, i.e., 3.57R, the resistance Rb of the second resistor section 12 corresponds to the region resistance of the first region R111, i.e., 4.61R, the resistance Rc of the third resistor section 13 corresponds to the region resistance of the second region R112, i.e., 4.27R, and the resistance Rd of the fourth resistor section 14 corresponds to the region resistance of the third region R113, i.e., 3.85R.

In the first magnetic sensor according to the comparative example, according to the expression (1), the electric potential E1 of the first output port E11, when no external magnetic field is applied to the magnetic sensor device according to the comparative example, is 0.564E. According to the expression (2), the electric potential E2 of the second output port E12, when no external magnetic field is applied to the magnetic sensor device according to the comparative example, is 0.526E. Accordingly, when no external magnetic field is applied to the magnetic sensor device according to the comparative example, the potential difference between the first output port E11 and the second output port E12 is 0.038E.

The offset of the first detection signal S1 is directly proportional to the potential difference between the first output port E11 and the second output port E12, when no external magnetic field is applied to the magnetic sensor device 1. As described above, in the first magnetic sensor 10, the potential difference between the first output port E11 and the second output port E12, when no external magnetic field is applied to the magnetic sensor device 1, is less than that of the first magnetic sensor according to the comparative example. Therefore, the first magnetic sensor 10 according to the present embodiment has less offset of the first detection signal S1 than the first magnetic sensor according to the comparative example.

Next, the offset of the second detection signal S2 generated by each of the second magnetic sensor 20 and the second magnetic sensor according to the comparative example will be described. Here, a symbol Ra represents the resistance of the first resistor section 21, a symbol Rb represents the resistance of the second resistor section 22, a symbol Rc represents the resistance of the third resistor section 23, and Rd represents the resistance of the fourth resistor section 24. When a symbol E represents a voltage value applied to the power port V2, the electric potential E1 of the first output port E21 is represented by the expression (1). The electric potential E2 of the second output port E22 is represented by the expression (2).

The region resistance of each of the first to sixth regions R21 to R26 shown in FIG. 18 is as follows. When no external magnetic field is applied to the magnetic sensor device 1, the region resistance of the first region R21 is 0.83R, the region resistance of the second region R22 is 1.91R, the region resistance of the third region R23 is 1.11R, the region resistance of the fourth region R24 is 0.91R, the region resistance of the fifth region R25 is 2.11R, and the region resistance of the sixth region R26 is 1.25R.

In the second magnetic sensor 20, when no external magnetic field is applied to the magnetic sensor device 1, the resistance Ra of the first resistor section 21 corresponds to the sum of the region resistance of the first region R21 and the region resistance of the third region R23, i.e., 1.94R, the resistance Rb of the second resistor section 22 corresponds to the sum of the region resistance of the fourth region R24 and the region resistance of the sixth region R26, i.e., 2.16R, the resistance Rc of the third resistor section 23 corresponds to the region resistance of the fifth region R25, i.e., 2.11R, and the resistance Rd of the fourth resistor section 24 corresponds to the region resistance of the fourth region R24, i.e., 1.91R.

In the second magnetic sensor 20, according to the expression (1), the electric potential E1 of the first output port E21, when no external magnetic field is applied to the magnetic sensor device 1, is 0.527E. According to the expression (2), the electric potential E2 of the second output port E22, when no external magnetic field is applied to the magnetic sensor device 1, is 0.525E. Accordingly, when no external magnetic field is applied to the magnetic sensor device 1, the potential difference between the first output port E21 and the second output port E22 is 0.002E.

The region resistance of each of the first to fourth regions R121 to R124 shown in FIG. 22 is as follows. When no external magnetic field is applied to the magnetic sensor device 1, the region resistance of the first region R121 is 1.74R, the region resistance of the second region R122 is 2.11R, the region resistance of the third region R123 is 1.91R, and the region resistance of the fourth region R124 is 2.36R.

In the second magnetic sensor according to the comparative example, when no external magnetic field is applied to the magnetic sensor device according to the comparative example, the resistance Ra of the first resistor section 21 corresponds to the region resistance of the first region R211, i.e., 1.74R, the resistance Rb of the second resistor section 22 corresponds to the region resistance of the third region R213, i.e., 1.91R, the resistance Rc of the third resistor section 23 corresponds to the region resistance of the fourth region R214, i.e., 2.36R, and the resistance Rd of the fourth resistor section 24 corresponds to the region resistance of the second region R212, i.e., 2.11R.

In the second magnetic sensor according to the comparative example, according to the expression (1), the electric potential E1 of the first output port E21, when no external magnetic field is applied to the magnetic sensor device according to the comparative example, is 0.523E. According to the expression (2), the electric potential E2 of the second output port E22, when no external magnetic field is applied to the magnetic sensor device according to the comparative example, is 0.528E. Accordingly, when no external magnetic field is applied to the magnetic sensor device according to the comparative example, the potential difference between the first output port E21 and the second output port E22 is 0.005E.

The offset of the second detection signal S2 is directly proportional to the potential difference between the first output port E21 and the second output port E22, when no external magnetic field is applied to the magnetic sensor device 1. As described above, in the second magnetic sensor 20, the potential difference between the first output port E21 and the second output port E22, when no external magnetic field is applied to the magnetic sensor device 1, is less than that of the second magnetic sensor according to the comparative example. Therefore, the second magnetic sensor 20 according to the present embodiment has less offset of the second detection signal S2 than the second magnetic sensor according to the comparative example.

As described above, according to the present embodiment, it is possible to reduce the offset of each of the first and second detection signals S1 and S2.

In the present embodiment, the arrangement of the first to fourth regions R11 to R14 and the arrangement of the first to sixth regions R21 to R26 are changed for each of the four regions R1 to R4 of the top surface of the wafer W shown in FIG. 8. Thereby, according to the present embodiment, it is possible to reduce variations in the offset of the first detection signal S1 among a plurality of the first magnetic sensors 10 manufactured from the same wafer W, and it is possible to reduce variations in the offset of the second detection signal S2 among a plurality of the second magnetic sensors 20 manufactured from the same wafer W.

By the way, variation in the thickness of the photoresist layer 70 causes variation in the shape anisotropy of the free layer of the MR element 30, irrespective of the area of the top surface 30a of the MR element 30. Variation in the shape anisotropy of the free layer of the MR element 30 causes deviations in a state of variation of the electric potential of each output port in accordance with variation in stress and in a state of variation of the electric potential of each output port in accordance with variation in temperature from desired states.

As described above, in the present embodiment, the offset of each of the first and second detection signals S1 and S2 is reduced. This is because in the Wheatstone bridge circuit, the resistances of the two resistor sections on the side of the power port in the two half bridge circuits are in balance, and the resistances of the two resistor sections on the side of the ground port in the two half bridge circuits are in balance. The reason why the resistances are in balance is that the average MR elements 30 constituting the two resistor sections on the side of the power port in the two half bridge circuits have reduced difference in planar shape, and the average MR elements 30 constituting the two resistor sections on the side of the ground port in the two half bridge circuits have reduced difference in planar shape. Accordingly, the average MR elements 30 constituting the two resistor sections on the side of the power port in the two half bridge circuits have reduced difference in shape anisotropy of the free layers, and the average MR elements 30 constituting the two resistor sections on the side of the ground port in the two half bridge circuits have reduced difference in shape anisotropy of the free layers. Therefore, according to the present embodiment, it is possible to prevent a state of variation of the electric potential of each output port in accordance with variation in stress and a state of variation of the electric potential of each output port in accordance with variation in temperature from being deviated from the desired states.

As described above, according to the present embodiment, the arrangement of the first to fourth regions R11 to R14 and the arrangement of the first to sixth regions R21 to R26 are changed for each of the four regions R1 to R4 of the top surface of the wafer W shown in FIG. 8. Thereby, according to the present embodiment, it is possible to prevent the state of variation of the electric potential of each output port in accordance with variation in stress and the state of variation of the electric potential of each output port in accordance with variation in temperature from being deviated from the desired states, among the plurality of first magnetic sensors 10 or the plurality of second magnetic sensors 20 manufactured from the same wafer W.

As a method for reducing the offset of each of the first and second detection signals S1 and S2, a method in which each resistor section is divided into a plurality of partial resistor sections and the number of the partial resistor sections is increased is conceivable. The greater the number of the partial resistor sections, the more likely the plurality of partial resistor sections are arranged in balance such that the average MR elements 30 constituting the respective partial resistor sections have reduced difference in planar shape. However, increase in the number of the partial resistor sections causes increase in the number of wires connecting between the partial resistor sections, and as a result, a problem of reduction in the area of the top surface 30a of each of the MR elements 30 and a problem of reduction in the number of the MR elements 30 per unit area occur. In the present embodiment, the number of division of the single resistor section is set at two, and the sum of the number of the partial resistor sections and the number of the resistor sections having no partial resistor section is set at six. Therefore, according to the present embodiment, it is possible to prevent the occurrence of the problems due to the increase in the number of the partial resistor sections, while reducing the offset of each of the first and second detection signals S1 and S2.

According to the aforementioned description, in the first magnetic sensor 10, the first resistor section 11, the second resistor section 12, the third resistor section 13, and the fourth resistor section 14 are constituted of the first group, the second group, the third group, and the fourth group, respectively, and are constituted of the element group in the third region R13, the element group in the first region R11, the element group in the second region R12, and the element group in the fourth region R14, respectively. However, the aforementioned description relating to the effects of the first magnetic sensor 10 holds true for a case in which the groups and the element groups constituting the first to fourth resistor sections 11 to 14 are exchanged by a predetermined rule.

In exchanging the groups, the aforementioned description relating to the effects of the first magnetic sensor 10 holds true for a case where the first resistor section 11, the second resistor section 12, the third resistor section 13, and the fourth resistor section 14 are constituted of the second group, the first group, the fourth group, and the third group, respectively. In exchanging the element groups, the aforementioned description relating to the effects of the first magnetic sensor 10 holds true for a case where the first resistor section 11, the second resistor section 12, the third resistor section 13, and the fourth resistor section 14 are constituted of the element group in the first region R11, the element group in the third region R13, the element group in the fourth region R14, and the element group in the second region R12, respectively.

Likewise, according to the aforementioned description, in the second magnetic sensor 20, the first resistor section 21, the second resistor section 22, the third resistor section 23, and the fourth resistor section 24 are constituted of the first group, the second group, the third group, and the fourth group, respectively, and correspond to the first divided resistor section, the second divided resistor section, the first undivided resistor section, and the second undivided resistor section, respectively. However, the aforementioned description relating to the effects of the second magnetic sensor 20 holds true for a case in which the groups constituting the first to fourth resistor sections 21 to 24 are exchanged by a predetermined rule and the resistor sections corresponding to the first and second divided resistor sections and the first and second undivided resistor sections are exchanged by a predetermined rule.

In exchanging the groups, the aforementioned description relating to the effects of the second magnetic sensor 20 holds true for a case where the first resistor section 21, the second resistor section 22, the third resistor section 23, and the fourth resistor section 24 are constituted of the second group, the first group, the fourth group, and the third group, respectively; constituted of the first group, the fourth group, the third group, and the second group, respectively; or constituted of the third group, the second group, the first group, and the fourth group, respectively. In exchanging the resistor sections corresponding to the first and second divided resistor sections and the first and second undivided resistor sections, the aforementioned description relating to the effects of the second magnetic sensor 20 holds true for a case where any of sets of ordered four resistor sections, including a set of the first resistor section 21, the third resistor section 23, the second resistor section 22, and the fourth resistor section 24, a set of the first resistor section 21, the third resistor section 23, the fourth resistor section 24, and the second resistor section 22, a set of the first resistor section 21, the fourth resistor section 24, the third resistor section 23, and the second resistor section 22, and a set of the second resistor section 22, the third resistor section 23, the fourth resistor section 24, and the first resistor section 21 corresponds to a set of the first divided resistor section, the second divided resistor section, the first undivided resistor section, and the second undivided resistor section.

Second Embodiment

Figure 23:
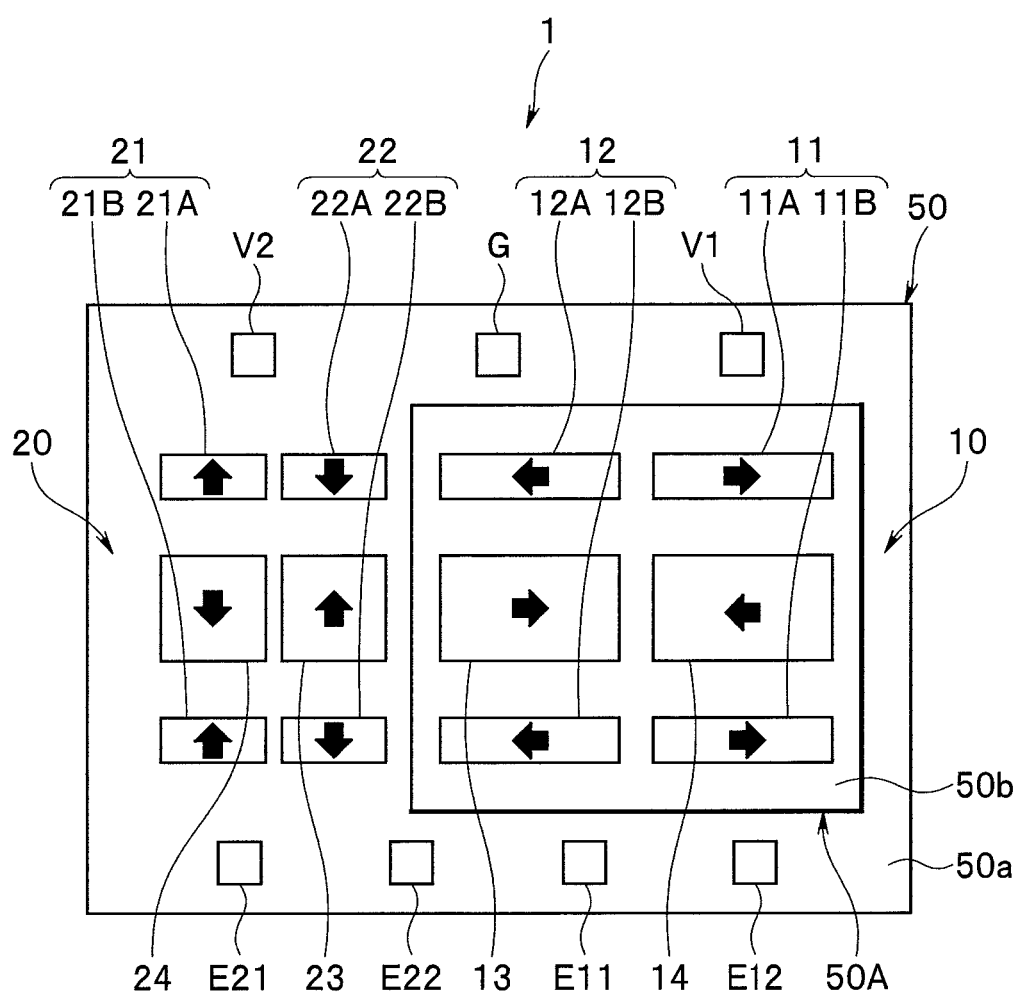
FIG. 23 is a plan view showing a magnetic sensor device of a second embodiment of the invention.
Figure 24:
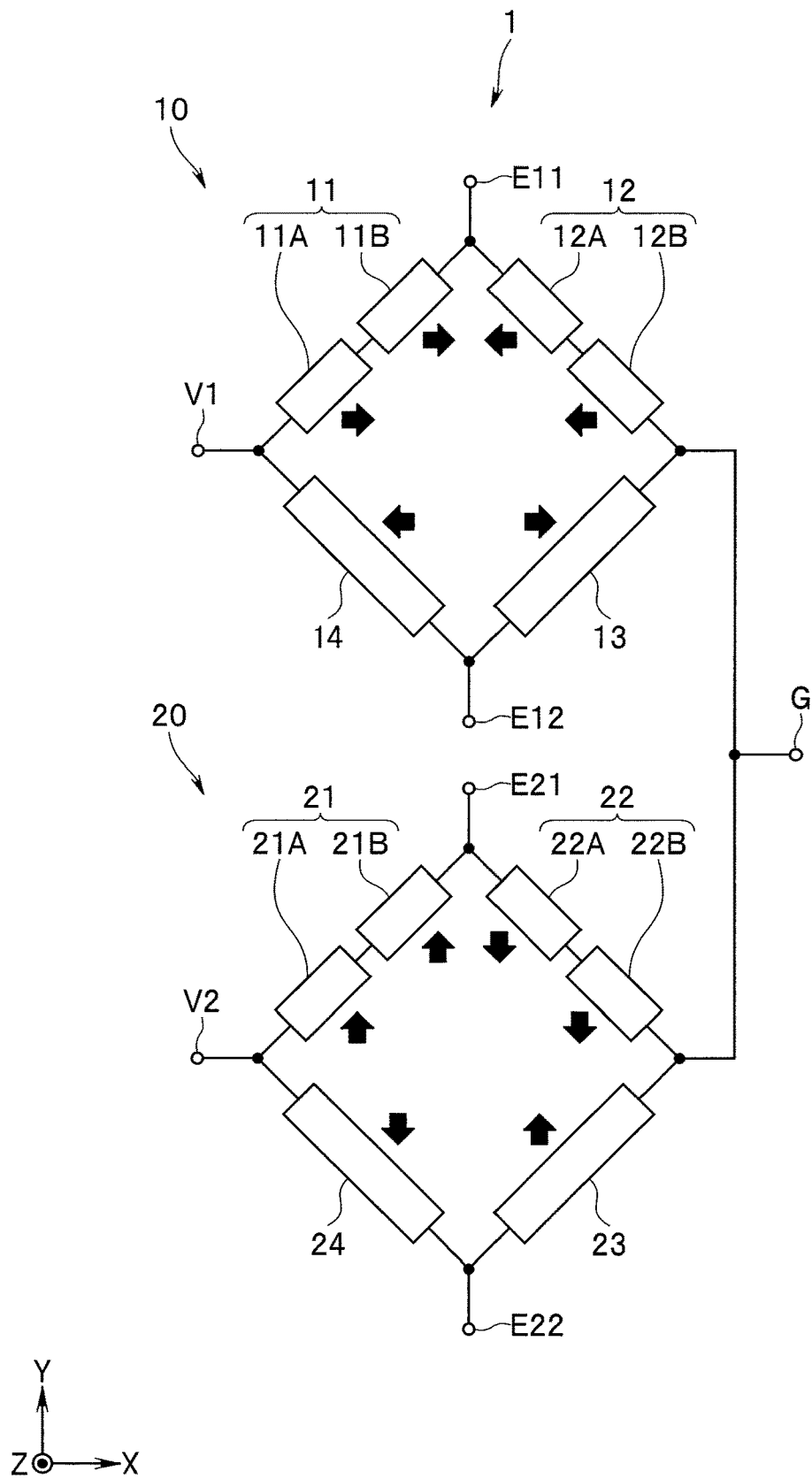
FIG. 24 is a circuit diagram showing the circuit configuration of the magnetic sensor device of the second embodiment of the invention.

A second embodiment of the invention will now be described with reference to FIGS. 23 to 28. FIG. 23 is a plan view showing a magnetic sensor device of a present embodiment. FIG. 24 is a circuit diagram showing the circuit configuration of the magnetic sensor device of the present embodiment. FIGS. 25 to 28 are explanatory diagrams of the arrangement of a plurality of MR elements included in first to fourth types of the magnetic sensor devices according to the present embodiment, respectively.

In the present embodiment, the configuration of the first magnetic sensor 10 is different from that in the first embodiment. As shown in FIGS. 23 and 24, in the present embodiment, the first resistor section 11 of the first magnetic sensor 10 includes two partial resistor sections 11A and 11B. As shown in FIG. 24, the partial resistor sections 11A and 11B are connected in this order in series from the side of the power port V1. As shown in FIGS. 23 and 24, the second resistor section 12 of the first magnetic sensor 10 includes two partial resistor sections 12A and 12B. As shown in FIG. 24, the partial resistor sections 12A and 12B are connected in this order in series from the side of the power port V1.

In the present embodiment, two or more MR elements 30 belong to each of the first and second groups of the first magnetic sensor 10. The first group includes first and second sub groups. The second group includes third and fourth sub groups. To each of the first to fourth sub groups, a set of one or more MR elements 30, i.e., an element group belongs.

In the first magnetic sensor 10 according to the present embodiment, each of the plurality of MR elements 30 constituting the first to fourth resistor sections 11 to 14 is located in any of a first region R211, a second region R212, a third region R213, a fourth region R214, a fifth region R215, and a sixth region R216 of the second surface 50b of the support member 50, and a set of one or more MR elements 30 of the plurality of MR elements 30, i.e., an element group is located in each of the first to sixth regions R211 to R216.

The element group in the first region R211 and the element group in the third region R213 constitute a first divided resistor section. The element group in the fourth region R214 and the element group in the sixth region R216 constitute a second divided resistor section. The element group in the fifth region R215 constitutes a first undivided resistor section. The element group in the second region R212 constitutes a second undivided resistor section.

The first resistor section 11 corresponds to a first divided resistor section. The partial resistor section 11A of the first resistor section 11 is constituted of the element group of the first sub group. The element group of the first sub group (partial resistor section 11A) is located in the first region R211.

The partial resistor section 11B of the first resistor section 11 is constituted of the element group of the second sub group. The element group of the second sub group (partial resistor section 11B) is located in the third region R213.

The second resistor section 22 corresponds to a second divided resistor section. The partial resistor section 12A of the second resistor section 12 is constituted of the element group of the third sub group. The element group of the third sub group (partial resistor section 12A) is located in the fourth region R214.

The partial resistor section 12B of the second resistor section 12 is constituted of the element group of the fourth sub group. The element group of the fourth sub group (partial resistor section 12B) is located in the sixth region R216.

The third resistor section 23 corresponds to the first undivided resistor section. The element group of the third group of the first magnetic sensor 10 (third resistor section 13) is located in the fifth region R215. The fourth resistor section 24 corresponds to the second undivided resistor section. The element group of the fourth group of the first magnetic sensor 10 (fourth resistor section 14) is located in the second region R212.

In the first magnetic sensor 10 according to the present embodiment, a portion Eb positioned at an end of the outer edge of the stepped section 50A of the support member 50 in the −X direction corresponds to the "reference portion". The first to third regions R211 to R213 are arranged along the second virtual straight line L2. The fourth to sixth regions R214 to R216 are located at different positions from the first to third regions R211 to R213 in a direction parallel to the X direction. The fourth to sixth regions R214 to R216 are arranged along the second virtual straight line L2.

Figure 25:
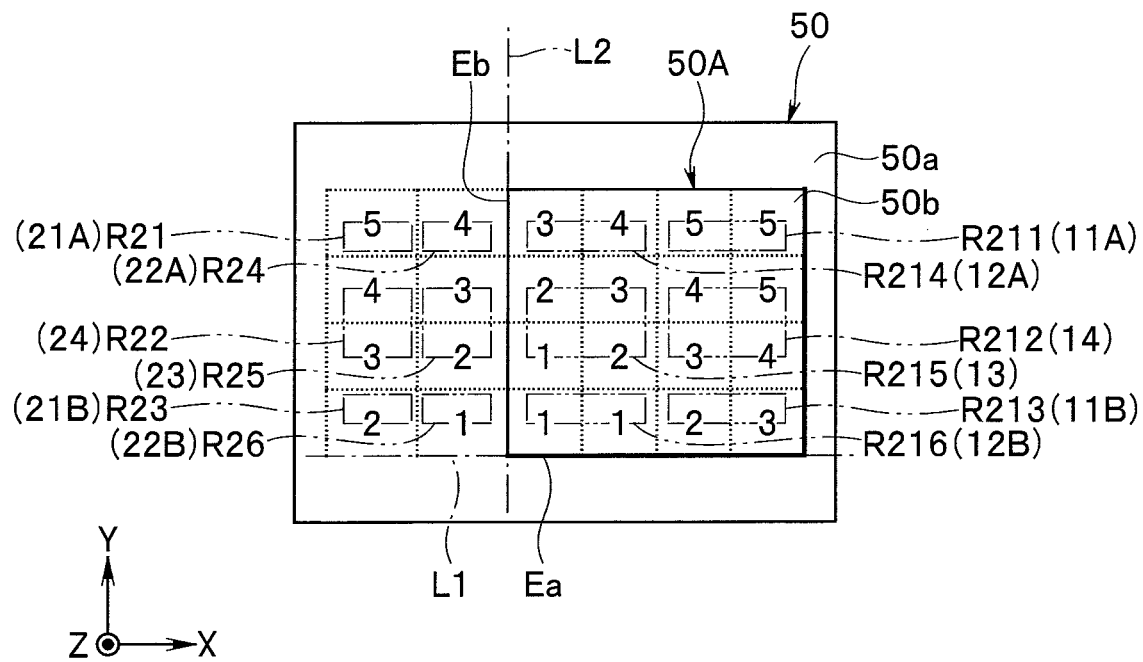
FIG. 25 is an explanatory diagram of the arrangement of a plurality of magnetoresistive elements included in the magnetic sensor device of a first type according to the second embodiment of the invention.
Figure 26:
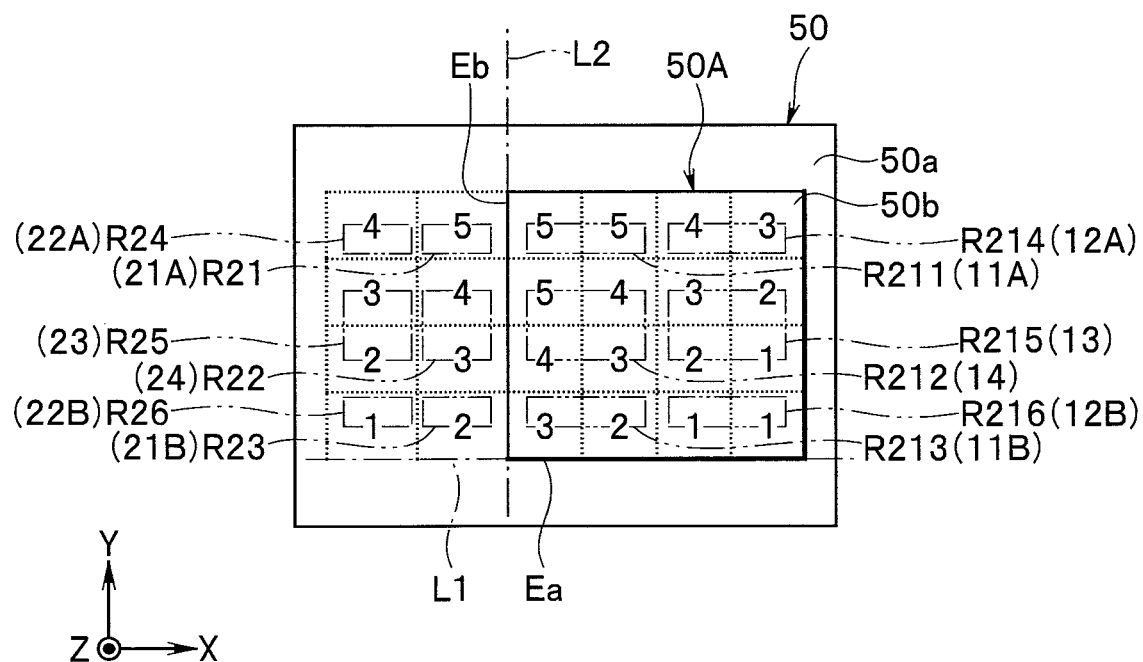
FIG. 26 is an explanatory diagram of the arrangement of a plurality of magnetoresistive elements included in the magnetic sensor device of a second type according to the second embodiment of the invention.
Figure 27:
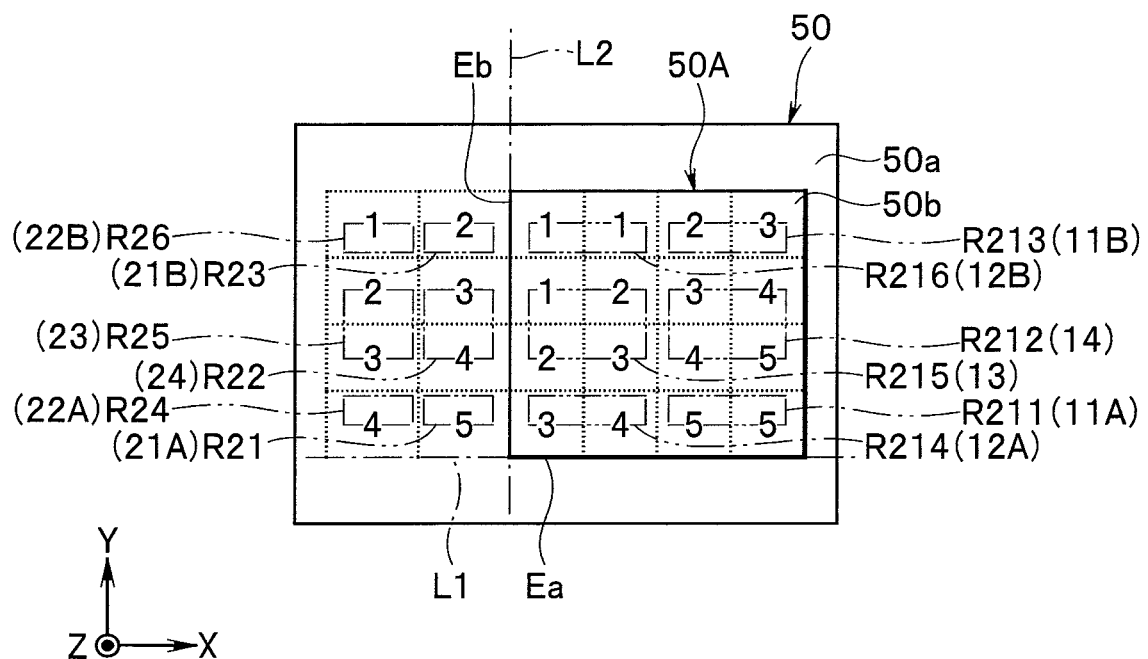
FIG. 27 is an explanatory diagram of the arrangement of a plurality of magnetoresistive elements included in the magnetic sensor device of a third type according to the second embodiment of the invention.
Figure 28:
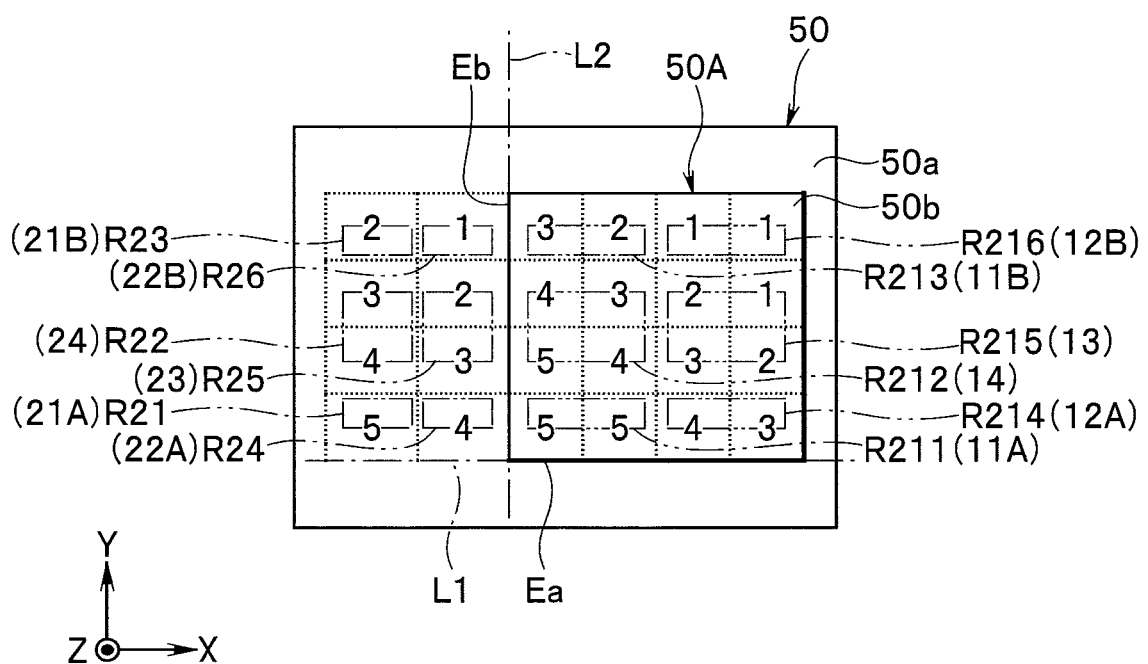
FIG. 28 is an explanatory diagram of the arrangement of a plurality of magnetoresistive elements included in the magnetic sensor device of a fourth type according to the second embodiment of the invention.

As shown in FIGS. 25 to 28, the arrangement of the first to sixth regions R211 to R216 is different from one type of the magnetic sensor device 1 to another. For example, as shown in FIG. 25, in the first type of magnetic sensor device 1, the first to third regions R211 to R213 are arranged in this order in the −Y direction. The fourth to sixth regions R214 to R216 are arranged in this order in the −Y direction on a front side of the first to third regions R211 to R213 in the −X direction. FIG. 25 shows the first type of magnetic sensor device 1 of the present embodiment.

The configuration, function and effects of the present embodiment are otherwise the same as those of the first embodiment.

Third Embodiment

Figure 29:
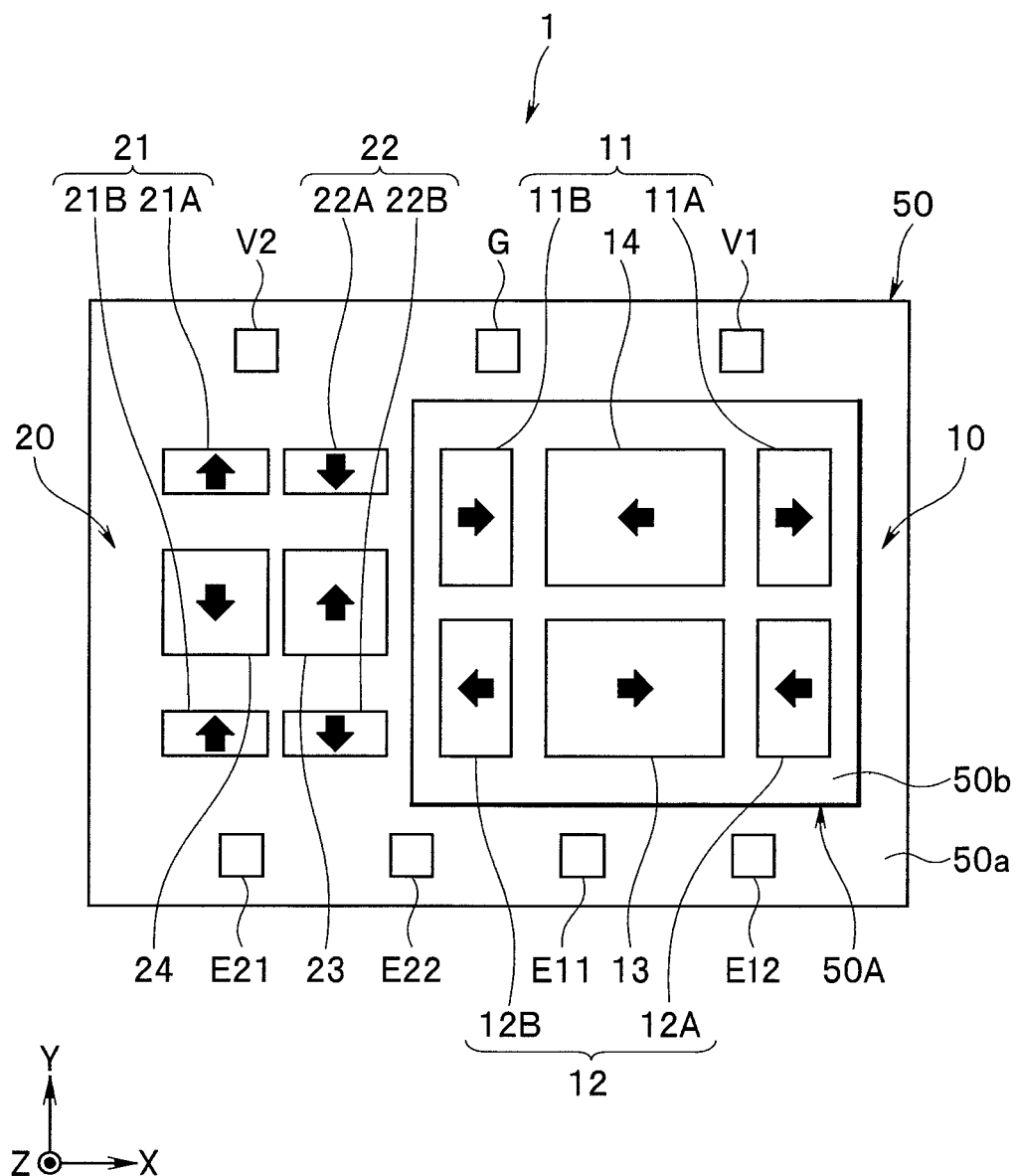
FIG. 29 is a plan view showing a magnetic sensor device of a third embodiment of the invention.

A third embodiment of the invention will now be described with reference to FIGS. 29 to 33. FIG. 29 is a plan view showing a magnetic sensor device of the present embodiment. FIGS. 30 to 33 are explanatory diagrams of the arrangement of a plurality of MR elements included in first to fourth types of the magnetic sensor devices according to the present embodiment, respectively.

In the present embodiment, the arrangement of the partial resistor sections 11A and 11B of the first resistor section 11, the partial resistor sections 12A and 12B of the second resistor section 12, the third resistor section 13, and the fourth resistor section 14 of the first magnetic sensor 10 is different from that in the second embodiment. In the first magnetic sensor 10 according to the present embodiment, each of the plurality of MR elements 30 constituting the first to fourth resistor sections 11 to 14 is located in any of a first region R311, a second region R312, a third region R313, a fourth region R314, a fifth region R315, and a sixth region R316 of the second surface 50b of the support member 50, and a set of one or more MR elements 30 of the plurality of MR elements 30, i.e., an element group is located in each of the first to sixth regions R311 to R316.

The element group in the first region R311 and the element group in the third region R313 constitute a first divided resistor section. The element group in the fourth region R314 and the element group in the sixth region R316 constitute a second divided resistor section. The element group in the fifth region R315 constitutes a first undivided resistor section. The element group in the second region R312 constitutes a second undivided resistor section.

In the present embodiment, an element group of the first sub group (partial resistor section 11A) is located in the first region R311. An element group of the second sub group (partial resistor section 11B) is located in the third region R313. An element group of the third sub group (partial resistor section 12A) is located in the fourth region R314. An element group of the fourth sub group (partial resistor section 12B) is located in the sixth region R316.

An element group of the third group (third resistor section 13) is located in the fifth region R315. An element group of the fourth group (fourth resistor section 14) is located in the second region R312.

In the first magnetic sensor 10 according to the present embodiment, a portion Ea positioned at an end of the outer edge of the stepped section 50A of the support member 50 in the −Y direction corresponds to the "reference portion". The first to third regions R311 to R313 are arranged along the first virtual straight line L1. The fourth to sixth regions R314 to R316 are located at different positions from the first to third regions R311 to R313 in a direction being orthogonal to a direction perpendicular to the first surface 50a and intersecting the first virtual straight line L1. The fourth to sixth regions R314 to R316 are arranged along the first virtual straight line L1.

Figure 30:
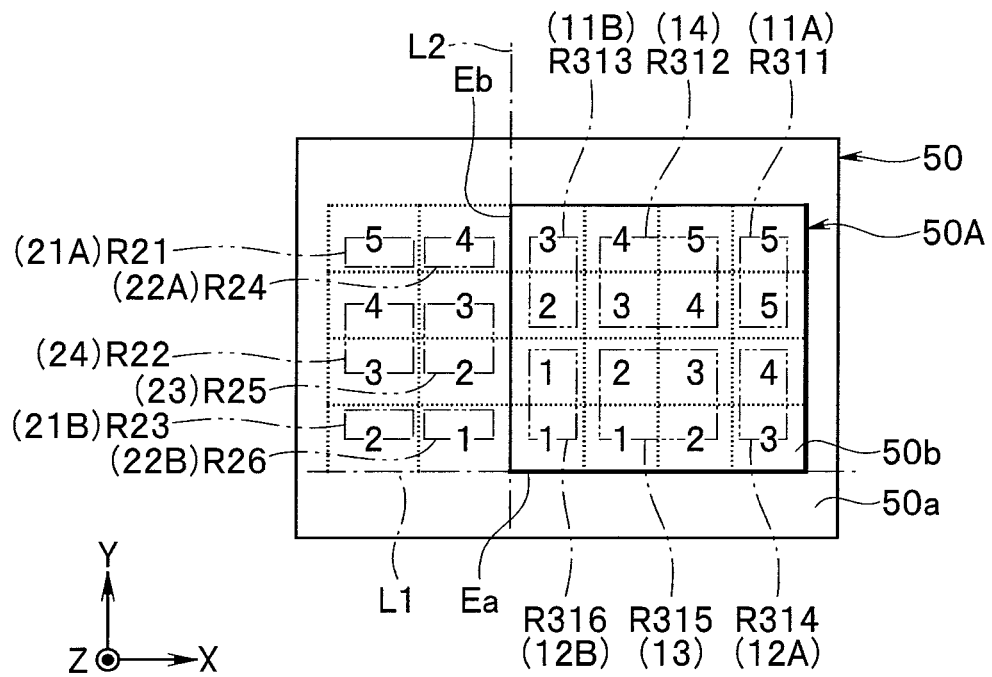
FIG. 30 is an explanatory diagram of the arrangement of a plurality of magnetoresistive elements included in the magnetic sensor device of a first type according to the third embodiment of the invention.
Figure 31:
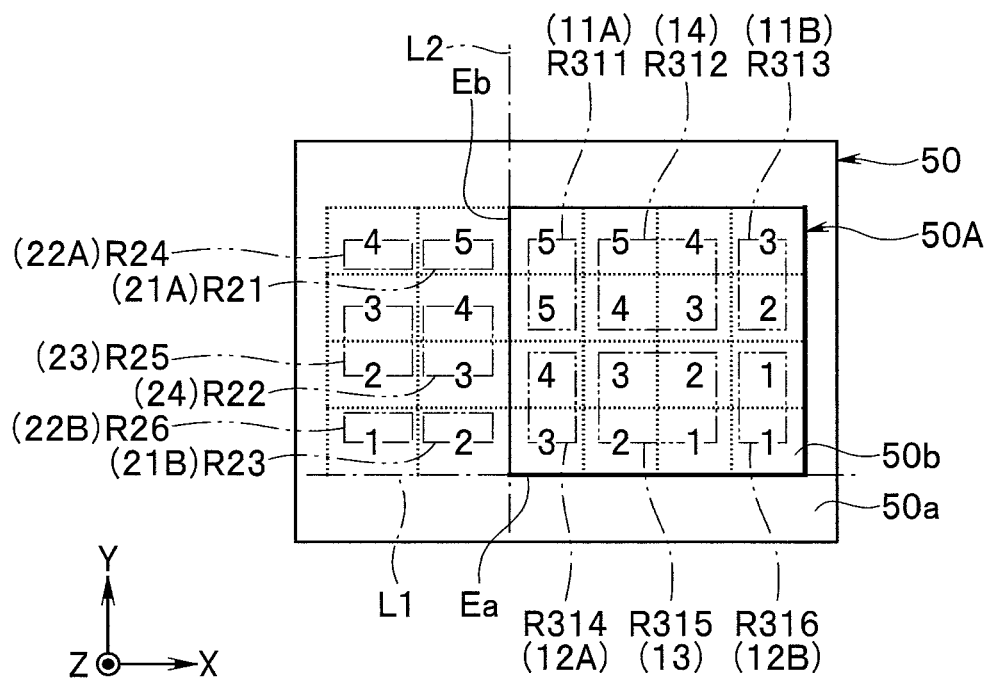
FIG. 31 is an explanatory diagram of the arrangement of a plurality of magnetoresistive elements included in the magnetic sensor device of a second type according to the third embodiment of the invention.
Figure 32:
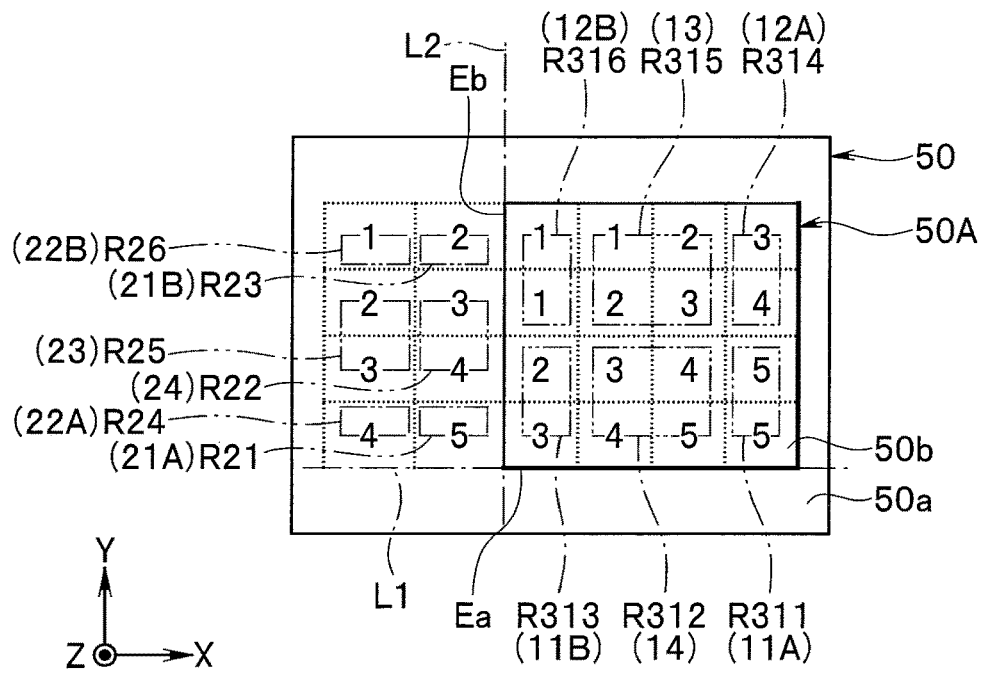
FIG. 32 is an explanatory diagram of the arrangement of a plurality of magnetoresistive elements included in the magnetic sensor device of a third type according to the third embodiment of the invention.
Figure 33:
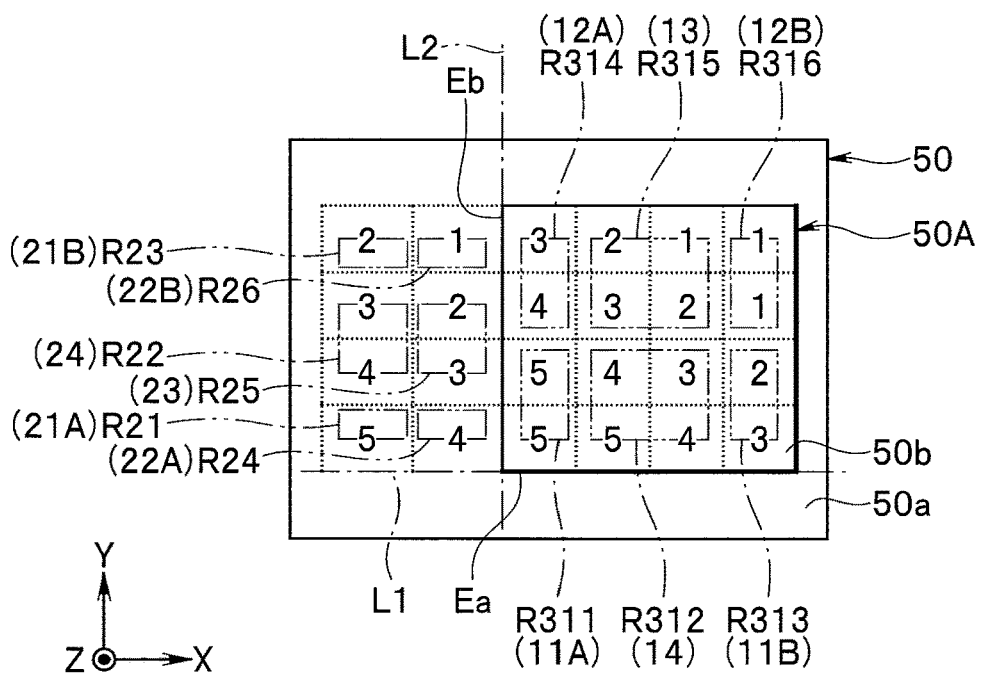
FIG. 33 is an explanatory diagram of the arrangement of a plurality of magnetoresistive elements included in the magnetic sensor device of a fourth type according to the third embodiment of the invention.

As shown in FIGS. 30 to 33, the arrangement of the first to sixth regions R311 to R316 is different from one type of the magnetic sensor device 1 to another. For example, as shown in FIG. 30, in the first type of magnetic sensor device 1, the first to third regions R311 to R313 are arranged in this order in the −X direction. The fourth to sixth regions R314 to R316 are arranged in this order in the −X direction on a front side of the first to third regions R211 to R213 in the −Y direction. FIG. 29 shows the first type of magnetic sensor device 1 of the present embodiment.

The configuration, function and effects of the present embodiment are otherwise the same as those of the second embodiment.

Fourth Embodiment

Figure 34:
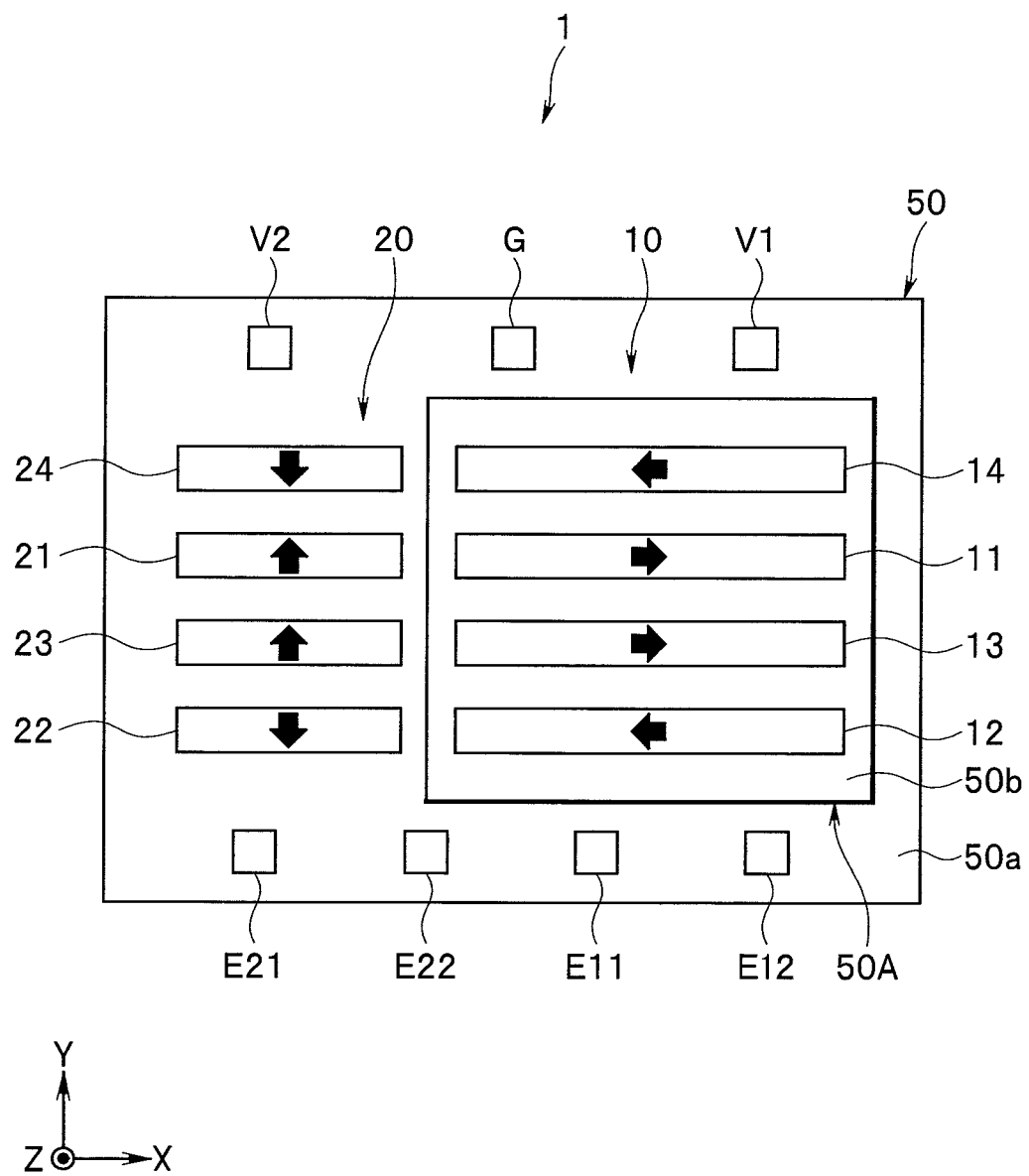
FIG. 34 is a plan view showing a magnetic sensor device of a fourth embodiment of the invention.
Figure 35:
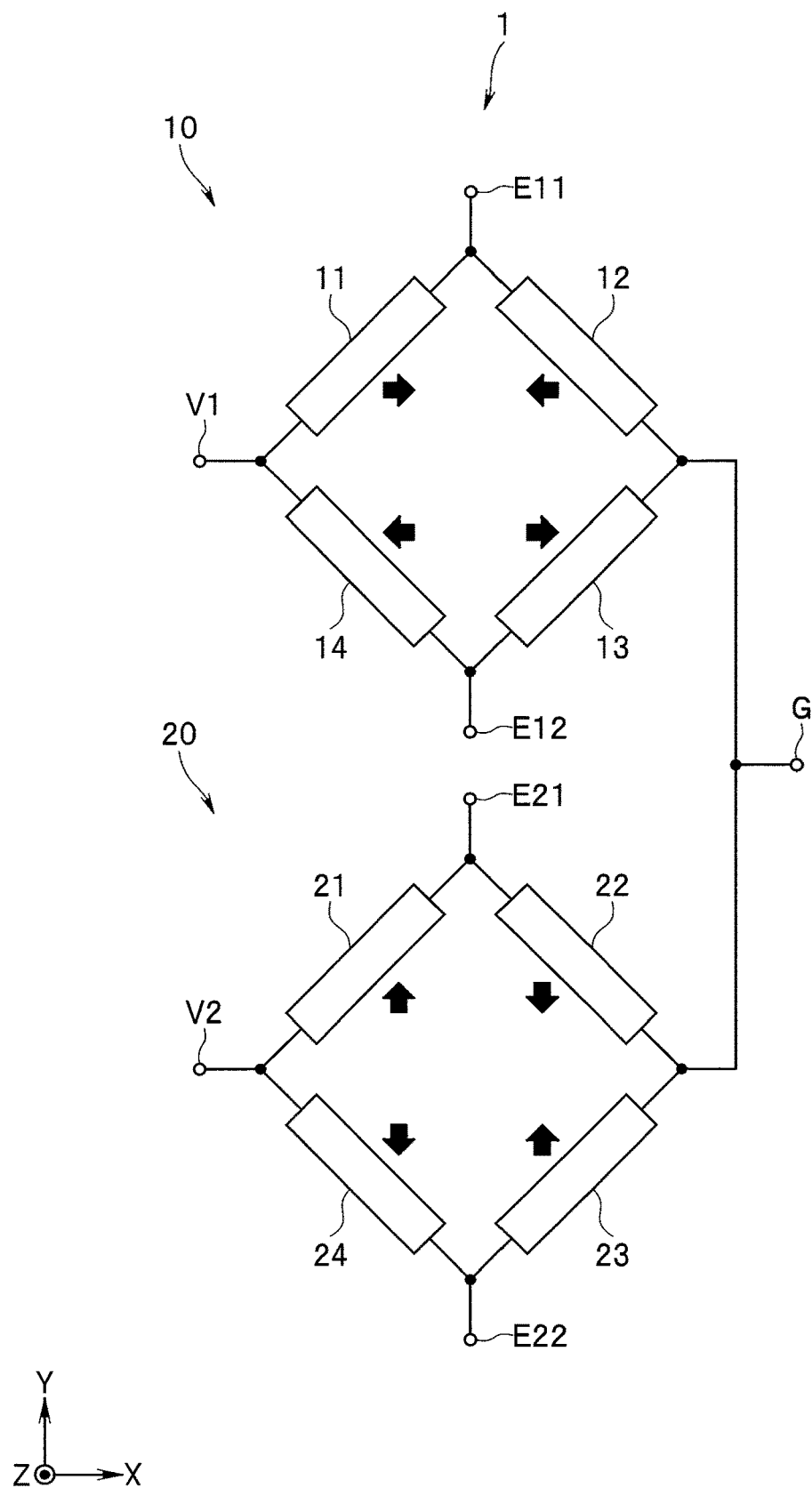
FIG. 35 is a circuit diagram showing the circuit configuration of the magnetic sensor device of the fourth embodiment of the invention.

A fourth embodiment of the invention will now be described with reference to FIGS. 34 to 39. FIG. 34 is a plan view showing a magnetic sensor device of a present embodiment. FIG. 35 is a circuit diagram showing the circuit configuration of the magnetic sensor device of the present embodiment. FIGS. 36 to 39 are explanatory diagrams of the arrangement of a plurality of MR elements included in first to fourth types of the magnetic sensor devices according to the present embodiment, respectively.

In the present embodiment, the arrangement of the first to fourth resistor section 11 to 14 of the first magnetic sensor 10 is different from that in the second embodiment. In the first magnetic sensor 10 according to the present embodiment, each of the plurality of MR elements 30 is located in any of a first region R411, a second region R412, a third region R413, and a fourth region R414 of the second surface 50b of the support member 50, and a set of one or more MR elements 30 of the plurality of MR elements 30, i.e., an element group is located in each of the first to fourth regions R411 to R414.

In the first magnetic sensor 10 according to the present embodiment, an element group of the first group (first resistor section 11) is located in the third region R413. An element group of the second group (second resistor section 12) is located in the first region R411. An element group of the third group (third resistor section 13) is located in the second region R412. An element group of the fourth group (fourth resistor section 14) is located in the fourth region R414.

The first to fourth regions R411 to R414 are arranged with respect to a reference portion, which is a part of an outer edge of the stepped section 50A of the support member 50. In the first magnetic sensor 10 according to the present embodiment, a portion Eb positioned at an end of the outer edge of the stepped section 50A of the support member 50 in the −X direction corresponds to the "reference portion". The first to fourth regions R411 to R414 are arranged along the second virtual straight line L2.

Figure 36:
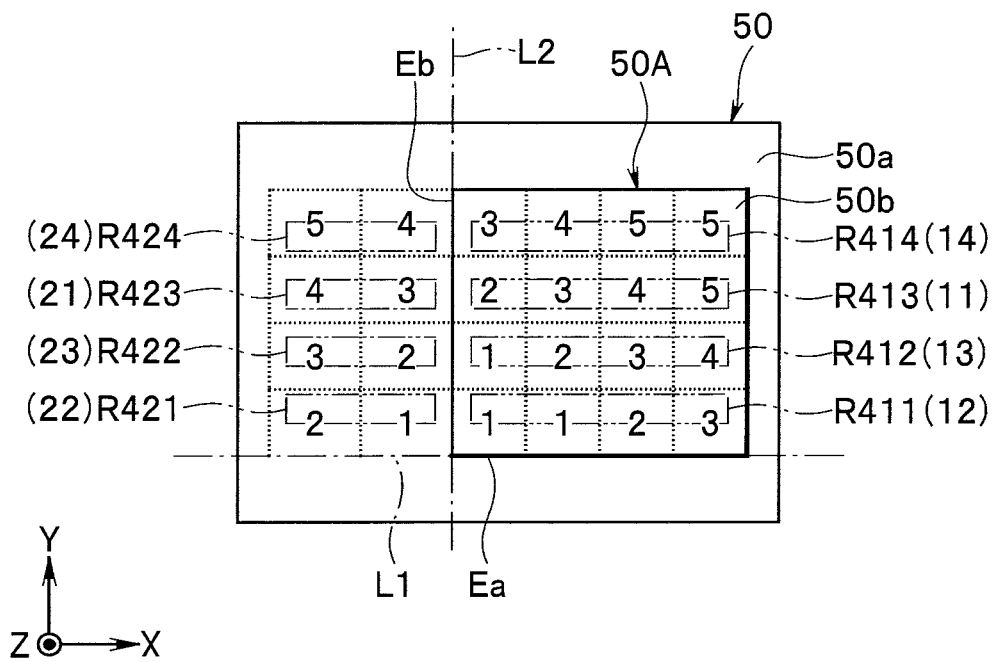
FIG. 36 is an explanatory diagram of the arrangement of a plurality of magnetoresistive elements included in the magnetic sensor device of a first type according to the fourth embodiment of the invention.
Figure 37:
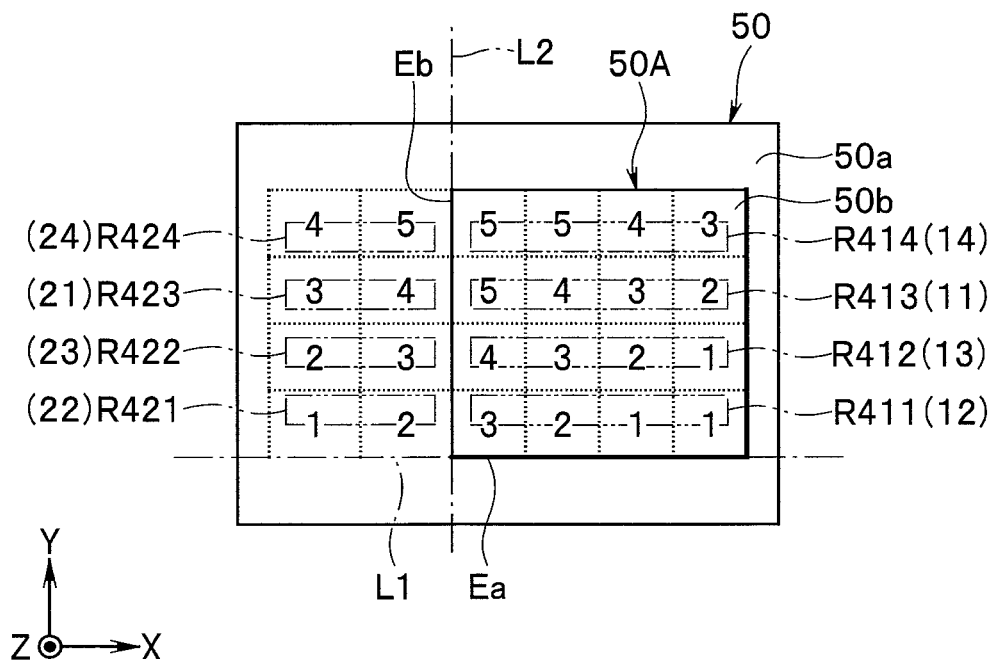
FIG. 37 is an explanatory diagram of the arrangement of a plurality of magnetoresistive elements included in the magnetic sensor device of a second type according to the fourth embodiment of the invention.
Figure 38:
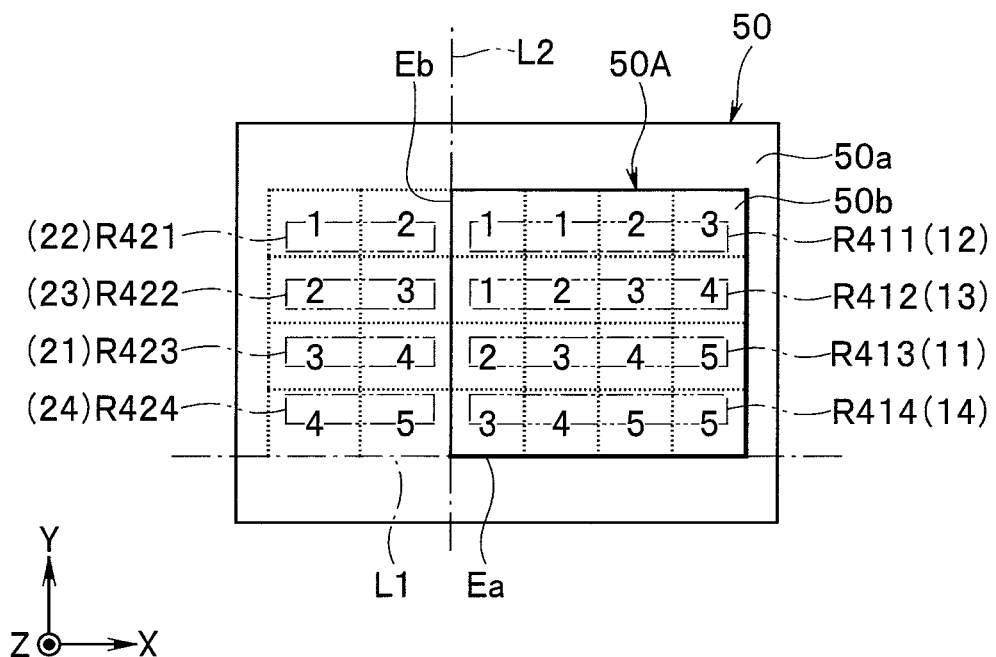
FIG. 38 is an explanatory diagram of the arrangement of a plurality of magnetoresistive elements included in the magnetic sensor device of a third type according to the fourth embodiment of the invention.
Figure 39:
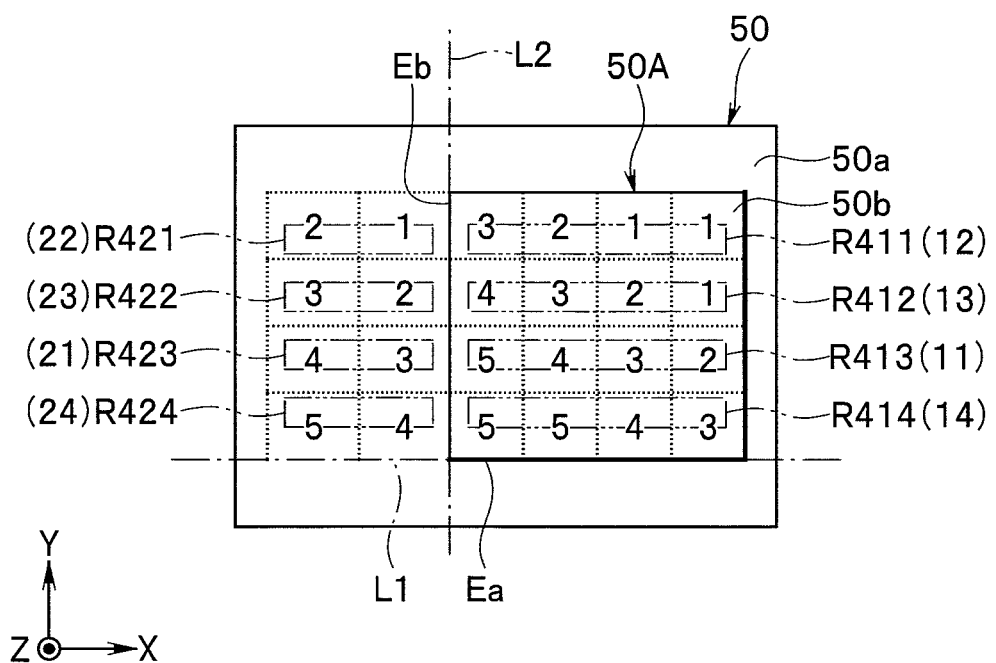
FIG. 39 is an explanatory diagram of the arrangement of a plurality of magnetoresistive elements included in the magnetic sensor device of a fourth type according to the fourth embodiment of the invention.

As shown in FIGS. 36 to 39, the arrangement of the first to fourth regions R411 to R414 is different from one type of the magnetic sensor device 1 to another. For example, as shown in FIG. 36, in the first type of magnetic sensor device 1, the first to fourth regions R411 to R414 are arranged in this order in the Y direction. FIG. 34 shows the first type of magnetic sensor device 1 of the present embodiment.

In the present embodiment, the configuration of the second magnetic sensor 20 is different from that in the first embodiment. As shown in FIGS. 34 and 35, according to the present embodiment, the first resistor section 21 of the second magnetic sensor 20 does not include the two partial resistor sections 21A and 21B of the first embodiment. As shown in FIGS. 34 and 35, the second resistor section 22 of the second magnetic sensor 20 does not include the two partial resistor sections 22A and 22B of the first embodiment.

In the second magnetic sensor 20 according to the present embodiment, each of the plurality of MR elements 30 constituting the first to fourth resistor sections 21 to 24 belongs to any of first to fourth groups, and a set of one or more MR elements 30 of the plurality of MR elements 30, i.e., an element group belongs to each of the first to fourth groups.

In the second magnetic sensor 20 according to the present embodiment, each of the plurality of MR elements 30 is located in any of a first region R421, a second region R422, a third region R423, and a fourth region R424 of the first surface 50a of the support member 50, and a set of one or more MR elements 30 of the plurality of MR elements 30, i.e., an element group is located in each of the first to fourth regions R421 to R424.

The first resistor section 21, the second resistor section 22, the third resistor section 23, and the fourth resistor section 24 are constituted of a first group, a second group, a third group, and a fourth group, respectively. An element group of the first group (first resistor section 21) is located in the third region R423. An element group of the second group (second resistor section 22) is located in the first region R421. An element group of the third group (third resistor section 23) is located in the second region R422. An element group of the fourth group (fourth resistor section 24) is located in the fourth region R424.

The first to fourth regions R421 to R424 are arranged with respect to a reference portion, which is a part of an outer edge of the stepped section 50A of the support member 50. In the second magnetic sensor 20 according to the present embodiment, a portion Eb positioned at an end of the outer edge of the stepped section 50A of the support member 50 in the −X direction corresponds to the "reference portion". The first to fourth regions R421 to R424 are arranged along the second virtual straight line L2.

As shown in FIGS. 36 to 39, the arrangement of the first to fourth regions R421 to R424 is different from one type of the magnetic sensor device 1 to another. For example, as shown in FIG. 36, in the first type of magnetic sensor device 1, the first to fourth regions R421 to R424 are arranged in this order in the Y direction.

The configuration, function and effects of the present embodiment are otherwise the same as those of the first embodiment.

The present invention is not limited to the foregoing embodiments, and various modifications may be made thereto. The configuration of the first and second magnetic sensors 10 and 20 is not limited to the example described in each of the embodiments but is arbitrary as long as it satisfies requirements of the scope of claims. For example, the first magnetic sensor 10 may include only the first and second resistor sections 11 and 12, or only the third and fourth resistor sections 13 and 14, of the first to fourth resistor sections 11 to 14. Similarly, the second magnetic sensor 20 may include only the first and second resistor sections 21 and 22, or only the third and fourth resistor sections 23 and 24, of the first to fourth resistor sections 21 to 24.

The second surface 50b of the support member 50 is not limited to the flat surface parallel to the XY plane, but may be an inclined surface or curved surface that is inclined with respect to the XY plane. In such a case, the first magnetic sensor 10 detects the target magnetic field MF, and may generate one or both of a signal having a correspondence with the strength of a component of the target magnetic field MF in the X direction and a signal having a correspondence with the strength of a component of the target magnetic field MF in the Z direction.

The support member 50 may include a recessed section that is recessed from the first surface 50a in the −Z direction, instead of the stepped section 50A. In such a case, the second surface 50b of the support member 50 may be a bottom surface of the recessed section.

The support member 50 may have a plurality of stepped sections, instead of the stepped section 50A. In such a case, the second surface 50b of the support member 50 is constituted of at least part of surfaces of the plurality of stepped sections. The second surface 50b of the support member 50 may be constituted of a plurality of flat surfaces parallel to the XY plane, or a plurality of inclined surfaces or a plurality of curved surfaces that are inclined with respect to the XY plane. When the second surface 50b of the support member 50 is constituted of the plurality of surfaces, the plurality of MR elements 30 of the first magnetic sensor 10 are located in each of the plurality of surfaces.

When the support member 50 has a plurality of stepped sections, the surfaces of the plurality of stepped sections may include a first section that is located at the same position as the first surface 50a in a direction perpendicular to the first surface 50a, and a second section that is located at a different position from the first surface 50a in the direction perpendicular to the first surface 50a. The ratio of the second section to the surfaces of the plurality of stepped sections may be, for example, 50% or more. In such a case, the second surface 50b of the support member 50 is constituted of the second section of the surfaces of the plurality of stepped sections.

When the support member 50 has the plurality of stepped sections, the plurality of regions of the first magnetic sensor 10 and the plurality of regions of the second magnetic sensor 20 are arranged with respect to a reference portion that is part of the outer edges of the plurality of stepped sections. The shape of the reference portion may be straight, just as with the portion Ea or Eb, or may be a shape whose direction periodically changes, such as a zigzag shape. When the reference portion has a shape whose direction periodically changes, the first and second virtual straight lines L1 and L2 are along the reference portion while intersecting a part of the reference portion.

In each of the above embodiments, only a case where the area of the top surface 30a of the MR element 30 decreases with reduction in the thickness of the photoresist layer 70 is described. However, the present invention is applicable to a case where the area of the top surface 30a of the MR element 30 increases with reduction in the thickness of the photoresist layer 70. Also in such a case, the offset of each of the first and second detection signals S1 and S2 can be reduced by defining each group based on the areas of the top surfaces 30a of the MR elements 30.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiments.

What is claimed is:

1. A magnetic sensor comprising:
a power port;
a ground port;
a first output port;
a second output port;
a first resistor section provided between the power port and the first output port;
a second resistor section provided between the ground port and the first output port;
a third resistor section provided between the ground port and the second output port;
a fourth resistor section provided between the power port and the second output port; and
a plurality of magnetoresistive elements constituting the first to fourth resistor sections, wherein
each of the plurality of magnetoresistive elements belongs to any of a first group, a second group, a third group, and a fourth group, and one or more magnetoresistive elements of the plurality of magnetoresistive elements belong to each of the first to fourth groups,
each of the plurality of magnetoresistive elements is constituted of a plurality of laminated layers, and has a top surface located at an end of the plurality of layers in a direction of lamination,
a maximum area of the top surfaces of the one or more magnetoresistive elements belonging to the first group is larger than areas of the top surfaces of all of the magnetoresistive elements belonging to the second to fourth groups,
a minimum area of the top surfaces of the one or more magnetoresistive elements belonging to the second group is smaller than areas of the top surfaces of all of the magnetoresistive elements belonging to the first, third, and fourth groups,
an average area of the top surfaces of the one or more magnetoresistive elements belonging to the third group is smaller than an average area of the top surfaces of the one or more magnetoresistive elements belonging to the fourth group,
the first resistor section, the second resistor section, the third resistor section, and the fourth resistor section are constituted of:
the first group, the second group, the third group, and the fourth group, respectively;
the second group, the first group, the fourth group, and the third group, respectively;
the first group, the fourth group, the third group, and the second group, respectively; or
the third group, the second group, the first group, and the fourth group, respectively,
the first group includes a first sub group and a second sub group,
the second group includes a third sub group and a fourth sub group,
the first sub group, the fourth group, and the second sub group are aligned in this order along a virtual straight line, and
the third sub group, the second group, and the fourth sub group are aligned in this order along the virtual straight line at different positions from the first sub group, the fourth group, and the second sub group in a direction that intersects the virtual straight line.

2. A magnetic sensor comprising:
a power port;
a ground port;
a first output port;
a second output port;
a first resistor section provided between the power port and the first output port;
a second resistor section provided between the ground port and the first output port;
a third resistor section provided between the ground port and the second output port;
a fourth resistor section provided between the power port and the second output port; and
a plurality of magnetoresistive elements constituting the first to fourth resistor sections, wherein
each of the plurality of magnetoresistive elements belongs to any of a first group, a second group, a third group, and a fourth group, and one or more magnetoresistive elements of the plurality of magnetoresistive elements belong to each of the first to fourth groups,
each of the plurality of magnetoresistive elements is constituted of a plurality of laminated layers, and has a top surface located at an end of the plurality of layers in a direction of lamination,
an average area of the top surfaces of the one or more magnetoresistive elements belonging to the third group is larger than an average area of the top surfaces of the one or more magnetoresistive elements belonging to the second group,
an average area of the top surfaces of the one or more magnetoresistive elements belonging to the first group is larger than an average area of the top surfaces of the one or more magnetoresistive elements belonging to the third group,
an average area of the top surfaces of the one or more magnetoresistive elements belonging to the fourth group is larger than an average area of top surfaces of the one or more magnetoresistive elements belonging to the first group,
the first resistor section, the second resistor section, the third resistor section, and the fourth resistor section are constituted of:
the first group, the second group, the third group, and the fourth group, respectively; or
the second group, the first group, the fourth group, and the third group, respectively, and
the second group, the third group, the first group, and the fourth group are aligned in this order along a virtual straight line.

3. A magnetic sensor comprising:
a power port;
a ground port;
a first output port;
a second output port;
a first resistor section provided between the power port and the first output port;
a second resistor section provided between the ground port and the first output port;
a third resistor section provided between the ground port and the second output port;
a fourth resistor section provided between the power port and the second output port;

a plurality of magnetoresistive elements constituting the first to fourth resistor sections; and a support member that supports the plurality of magnetoresistive elements, wherein each of the plurality of magnetoresistive elements is located in any of a first region, a second region, a third region, and another region that is other than the first to third regions, in each of the first to third regions, an element group, which is a set of one or more magnetoresistive elements of the plurality of magnetoresistive elements, is located, in the other region, two or more magnetoresistive elements of the plurality of magnetoresistive elements are located, the first to third regions are aligned along a virtual straight line, the other region is at a different position from the first to third regions in a direction that intersects the virtual straight line, the element group in the first region and the element group in the third region constitute a divided resistor section, the element group in the second region constitutes an undivided resistor section, any of sets of ordered two resistor sections, including a set of the first resistor section and the fourth resistor section, a set of the second resistor section and the third resistor section, a set of the first resistor section and the second resistor section, and a set of the second resistor section and the first resistor section, corresponds to a set of the divided resistor section and the undivided resistor section, and the two or more magnetoresistive elements in the other region constitute two resistor sections other than two resistor sections corresponding to the divided resistor section and the undivided resistor section.

4. The magnetic sensor according to claim 3, wherein the other region includes a fourth region, a fifth region, and a sixth region, in each of the fourth to sixth regions, an element group is located, the fourth to sixth regions are aligned along the virtual straight line, the element group in the first region and the element group in the third region constitute a first divided resistor section as the divided resistor section, the element group in the fourth region and the element group in the sixth region constitute a second divided resistor section, the element group in the fifth region constitutes a first undivided resistor section, the element group in the second region constitutes a second undivided resistor section as the undivided resistor section, and any of sets of ordered four resistor sections, including a set of the first resistor section, the second resistor section, the third resistor section, and the fourth resistor section, a set of the first resistor section, the third resistor section, the second resistor section, and the fourth resistor section, a set of the first resistor section, the third resistor section, the fourth resistor section, and the second resistor section, a set of the first resistor section, the fourth resistor section, the third resistor section, and the second resistor section, and a set of the second resistor section, the third resistor section, the fourth resistor section, and the first resistor section, corresponds to a set of the first divided resistor section, the second divided resistor section, the first undivided resistor section, and the second undivided resistor section.

5. The magnetic sensor according to claim 3, wherein the support member has a first section having a flat first surface, and a second section having a second surface located at a different position from the first surface in a first direction perpendicular to the first surface, the plurality of magnetoresistive elements are located on any of the first surface and the second surface of the support member, and the second surface is an inclined surface or a curved surface.

6. The magnetic sensor according to claim 3, wherein the support member has a flat surface, and the plurality of magnetoresistive elements are located on the flat surface of the support member.

7. The magnetic sensor according to claim 3, wherein the support member has an inclined surface or a curved surface, and the plurality of magnetoresistive elements are located on the inclined surface or the curved surface of the support member.

8. A magnetic sensor comprising:

a power port;

a ground port;

a first output port;

a second output port;

a first resistor section provided between the power port and the first output port;

a second resistor section provided between the ground port and the first output port;

a third resistor section provided between the ground port and the second output port;

a fourth resistor section provided between the power port and the second output port; and a plurality of magnetoresistive elements constituting the first to fourth resistor sections, and a support member that supports the plurality of magnetoresistive elements, wherein each of the plurality of magnetoresistive elements is located in any of a first region, a second region, a third region, and a fourth region, and an element group being a set of one or more magnetoresistive elements of the plurality of magnetoresistive elements is located in each of the first to fourth regions, the first to fourth regions are aligned along a virtual straight line, and the first resistor section, the second resistor section, the third resistor section, and the fourth resistor section are constituted of:

the element group in the third region, the element group in the first region, the element group in the second region, and the element group in the fourth region, respectively; or the element group in the first region, the element group in the third region, the element group in the fourth region, and the element group in the second region, respectively.

9. The magnetic sensor according to claim 8, wherein the support member has a first section having a flat first surface, and a second section having a second surface located at a different position from the first surface in a first direction perpendicular to the first surface, the plurality of magnetoresistive elements are located on any of the first surface and the second surface of the support member, and the second surface is an inclined surface or a curved surface.

10. The magnetic sensor according to claim 8, wherein the support member has a flat surface, and the plurality of magnetoresistive elements are located on the flat surface of the support member.

11. The magnetic sensor according to claim 8, wherein the support member has an inclined surface or a curved surface, and the plurality of magnetoresistive elements are located on the inclined surface or the curved surface of the support member.

* * * * *